US010803226B2

(12) United States Patent
Do et al.

(10) Patent No.: US 10,803,226 B2
(45) **Date of Patent: *Oct. 13, 2020**

(54) INTEGRATED CIRCUIT FOR MULTIPLE PATTERNING LITHOGRAPHY, A COMPUTING SYSTEM AND A COMPUTER-IMPLEMENTED METHOD FOR DESIGNING AN INTEGRATED CIRCUIT

(71) Applicant: SAMSUNG ELECTRONICS CO., LTD., Suwon-si, Gyeonggi-Do (KR)

(72) Inventors: Jung-Ho Do, Hwaseong-si (KR); Jong-Hoon Jung, Seongnam-si (KR); Seung-Young Lee, Seoul (KR); Tae-Joong Song, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/589,360

(22) Filed: Oct. 1, 2019

(65) Prior Publication Data

US 2020/0034508 A1 Jan. 30, 2020

Related U.S. Application Data

(63) Continuation of application No. 15/689,008, filed on Aug. 29, 2017, now Pat. No. 10,445,455.

(30) Foreign Application Priority Data

Dec. 16, 2016 (KR) ........................ 10-2016-0172894

(51) Int. Cl.
*G06F 30/392* (2020.01)
*G03F 7/20* (2006.01)
(Continued)

(52) U.S. Cl.
CPC .............. *G06F 30/392* (2020.01); *G03F 1/70* (2013.01); *G03F 7/70283* (2013.01);
(Continued)

(58) Field of Classification Search
CPC ............. G06F 17/5072; G06F 17/5081; G06F 17/5068; G06F 17/5009; G06F 30/392;
(Continued)

(56) References Cited

U.S. PATENT DOCUMENTS 7,444,614 B2 10/2008 Maeno et al.
7,681,168 B2 3/2010 Sakurabayashi
(Continued)

*Primary Examiner* — Nha T Nguyen
(74) *Attorney, Agent, or Firm* — F. Chau & Associates, LLC

(57) ABSTRACT

An integrated circuit includes: a lower layer including first and second lower patterns extending in a first direction; a first via arranged on the first lower pattern, and a second via arranged on the second lower pattern; a first upper pattern arranged on the first via; and a second upper pattern arranged on the second via, a first color is assigned to the first upper pattern, a second color is assigned to the second upper pattern, the first and second upper patterns are adjacent to each other in a second direction, and the first via is arranged in a first edge region of the first lower pattern, the first edge region being farther away from the second lower pattern than a second edge region of the first lower pattern, the second edge region being opposite to the first edge region.

20 Claims, 30 Drawing Sheets

(51) Int. Cl.
*G03F 1/70* (2012.01)
*G06F 30/20* (2020.01)
*G06F 30/39* (2020.01)
*G06F 30/398* (2020.01)

(52) U.S. Cl.
CPC .......... *G03F 7/70466* (2013.01); *G06F 30/20* (2020.01); *G06F 30/39* (2020.01); *G06F 30/398* (2020.01)

(58) Field of Classification Search
CPC ........ G06F 30/398; G06F 30/39; G06F 30/20; G03F 7/70; G03F 7/70283; G03F 1/70; G03F 7/70466; H01L 27/04; H01L 23/528
See application file for complete search history.

(56) References Cited

U.S. PATENT DOCUMENTS

| | | | |
|---|---|---|---|
| 7,886,238 | B1 | 2/2011 | Sharma et al. |
| 7,917,871 | B2 | 3/2011 | Kobayashi et al. |
| 8,434,043 | B1 | 4/2013 | Hsu et al. |
| 8,513,978 | B2 | 8/2013 | Sherlekar |
| 8,516,402 | B1 | 8/2013 | Wang |
| 8,701,054 | B2 | 4/2014 | Moroz et al. |
| 8,806,393 | B1 | 8/2014 | Greco et al. |
| 8,813,016 | B1 | 8/2014 | Hsu et al. |
| 8,935,639 | B1 | 1/2015 | Tzeng |
| 8,987,816 | B2 | 3/2015 | Stephens et al. |
| 8,987,828 | B2 * | 3/2015 | Moroz ............ H01L 21/823821 257/353 |
| 9,081,932 | B2 | 7/2015 | Liao et al. |
| 9,087,170 | B2 | 7/2015 | Hsu et al. |
| 9,348,962 | B2 | 5/2016 | Buck et al. |
| 9,390,223 | B2 | 7/2016 | Cheng et al. |
| 9,690,896 | B2 | 6/2017 | Seo et al. |
| 9,773,772 | B2 | 9/2017 | Lee et al. |
| 10,026,688 | B2 | 7/2018 | Lee et al. |
| 2004/0139407 | A1 | 7/2004 | Mukai et al. |
| 2005/0086617 | A1 | 4/2005 | Ciplickas et al. |
| 2006/0195810 | A1 | 8/2006 | Morton |
| 2007/0234243 | A1 | 10/2007 | Kyoh |
| 2009/0223857 | A1 | 9/2009 | Kornachuk et al. |
| 2011/0004353 | A1 | 1/2011 | Chang et al. |
| 2013/0159955 | A1 | 6/2013 | Ghaida et al. |
| 2015/0089457 | A1 | 3/2015 | Agarwal et al. |
| 2015/0234974 | A1 | 8/2015 | Dechene et al. |
| 2015/0286764 | A1 | 10/2015 | Yuan et al. |
| 2015/0286771 | A1 | 10/2015 | Choi et al. |
| 2015/0339422 | A1 | 11/2015 | Greco et al. |
| 2016/0098509 | A1 | 4/2016 | Seo et al. |
| 2016/0125117 | A1 | 5/2016 | Kim et al. |
| 2016/0147926 | A1 | 5/2016 | Chiang et al. |
| 2016/0254256 | A1 | 9/2016 | Baek et al. |
| 2017/0193148 | A1 | 7/2017 | Liu |
| 2017/0316140 | A1 | 11/2017 | Kim et al. |
| 2018/0004883 | A1 | 1/2018 | Yuan et al. |
| 2018/0164695 | A1 | 6/2018 | Hsieh et al. |
| 2018/0173835 | A1 | 6/2018 | Do et al. |

* cited by examiner

INTEGRATED CIRCUIT FOR MULTIPLE PATTERNING LITHOGRAPHY, A COMPUTING SYSTEM AND A COMPUTER-IMPLEMENTED METHOD FOR DESIGNING AN INTEGRATED CIRCUIT

CROSS-REFERENCE TO RELATED APPLICATIONS

This application is a continuation of U.S. patent application Ser. No. 15/689,008 filed on Aug. 29, 2017, which claims priority under 35 U.S.C. § 119 to Korean Patent Application No. 10-2016-0172894, filed on Dec. 16, 2016, in the Korean Intellectual Property Office, the disclosures of which are incorporated by reference herein in their entireties.

TECHNICAL FIELD

The inventive concept relates to an integrated circuit, and more particularly, to an integrated circuit for multiple patterning lithography (MPL), a computing system and a computer-implemented method for designing an integrated circuit.

DISCUSSION OF RELATED ART

As integrated circuits pack more circuitry into smaller footprints, gaps between adjacent patterns have shrunk. In such an integrated circuit, a plurality of patterns included in a layer may be formed by using a plurality of masks rather than a single mask. A patterning technology using a plurality of masks is referred to as multiple patterning lithography (MPL). To apply MPL, color decomposition is performed. In color decomposition, colors are assigned to a plurality of patterns.

SUMMARY

According to an exemplary embodiment of the inventive concept, there is provided an integrated circuit including: a lower layer including first and second lower patterns extending in a first direction; a first via arranged on the first lower pattern, and a second via arranged on the second lower pattern; and an upper layer including first and second upper patterns, wherein the first upper pattern is arranged on the first via, the second upper pattern is arranged on the second via, a first color is assigned to the first upper pattern, a second color is assigned to the second upper pattern, and the first and second upper patterns are adjacent to each other in a second direction perpendicular to the first direction, wherein a width of the first lower pattern in the second direction is greater than a width of the first via in the second direction, and the first via is arranged in a first edge region of the first lower pattern, the first edge region being farther away from the second lower pattern than a second edge region of the first lower pattern, the second edge region being opposite to the first edge region.

According to an exemplary embodiment of the inventive concept, there is provided a semiconductor device including: a substrate; a lower wiring layer including a left pattern and a right pattern arranged on the substrate to extend in a first direction; a first via arranged on a left edge region of the left pattern, and a second via arranged on a right edge region of the right pattern; and an upper wiring layer including first and second upper patterns extending in a second direction perpendicular to the first direction and adjacent to each other in the second direction, wherein the first upper pattern is formed on the first via and the second upper pattern is formed on the second via.

According to an exemplary embodiment of the inventive concept, there is provided a computer-implemented method for designing an integrated circuit, the method including: placing standard cells based on design data defining the integrated circuit, wherein a width of at least one of a first lower pattern and a second lower pattern which are included in a lower layer of the placed standard cells is greater than a width of the other lower pattern included in the lower layer, wherein the first and second lower patterns extend in a first direction; generating a layout of the integrated circuit by performing routing in which first and second vias are respectively arranged on the first and second lower patterns, and first and second upper patterns are respectively arranged on the first and second vias, to be adjacent to each other in a second direction perpendicular to the first direction; and storing the generated layout to a computer-readable storage medium, wherein the generating of the layout comprises at least one of arranging the first via on a first edge region of the first lower pattern, the first edge region being farther away from the second lower pattern than a second edge region of the first lower pattern, the second edge region being opposite to the first edge region, and arranging the second via on a third edge region of the second lower pattern, the third edge region being farther away from the first lower pattern than a fourth edge region of the second lower pattern, the fourth edge region being opposite to the third edge region.

According to an exemplary embodiment of the inventive concept, there is provided a computing system for designing an integrated circuit, the system including: a memory configured to store procedures for designing the integrated circuit; and a processor configured to access the memory and to execute the procedures, wherein the procedures include: a placer configured to place standard cells based on design data defining the integrated circuit, wherein a width of at least one of a first lower pattern and a second lower pattern which are included in a lower layer of the placed standard cells and extend in a first direction, is greater than a width of the other lower pattern included in the lower layer; and a router configured to perform a routing in which first and second vias are respectively arranged on the first and second lower patterns, and first and second upper patterns are respectively arranged on the first and second vias to be adjacent to each other in a second direction perpendicular to the first direction, wherein the router is configured to arrange the first via on a first edge region of the first lower pattern, the first edge region being farther away from the second lower pattern than a second edge region of the first lower pattern, the second edge region being opposite to the first edge region, or arrange the second via on a third edge region of the second lower pattern, the third edge region being farther away from the first lower pattern than a fourth edge region of the second lower pattern, the fourth edge region being opposite to the third edge region.

According to an exemplary embodiment of the inventive concept, there is provided a method of manufacturing a semiconductor device, the method being performed at least partially by a processor, and including: placing standard cells based on design data defining the integrated circuit, wherein a width of at least one of a first lower pattern and a second lower pattern included in a lower layer of the placed standard cells, and extending in a first direction, is greater than a width of the other lower pattern included in the lower layer; generating a layout of the integrated circuit by performing a routing in which first and second vias are respectively arranged on the first and second lower patterns, and first and second upper patterns are respectively arranged on the first and second vias, to be adjacent to each other in a second direction perpendicular to the first direction; and manufacturing the semiconductor device based on the generated layout, wherein the generating of the layout comprises at least one of arranging the first via on a first edge region of the first lower pattern, the first edge region being farther away from the second lower pattern than a second edge region of the first lower pattern, the second edge region being opposite to the first edge region, and arranging the second via on a third edge region of the second lower pattern, the third edge region being farther away from the first lower pattern than a fourth edge region of the second lower pattern, the fourth edge region being opposite to the third edge region.

According to an exemplary embodiment of the inventive concept, there is provided an integrated circuit including: first and second patterns extending lengthwise in a first direction; a first via disposed on the first pattern; a second via disposed on the second pattern, wherein a distance separating the first and second vias in a second direction crossing the first direction is greater than a distance separating the first and second patterns from each other in the second direction; a third pattern disposed on the first via, wherein the third pattern has a first color; and a fourth pattern disposed on the second via, wherein the fourth pattern has a second color.

BRIEF DESCRIPTION OF THE DRAWINGS

The above and other features of the inventive concept will be more clearly understood by describing in detail exemplary embodiments thereof with reference to the accompanying drawings in which.

DETAILED DESCRIPTION OF THE EMBODIMENTS

Hereinafter, exemplary embodiments of the present inventive concept will be described in detail by referring to the accompanying drawings.

Figure 1:
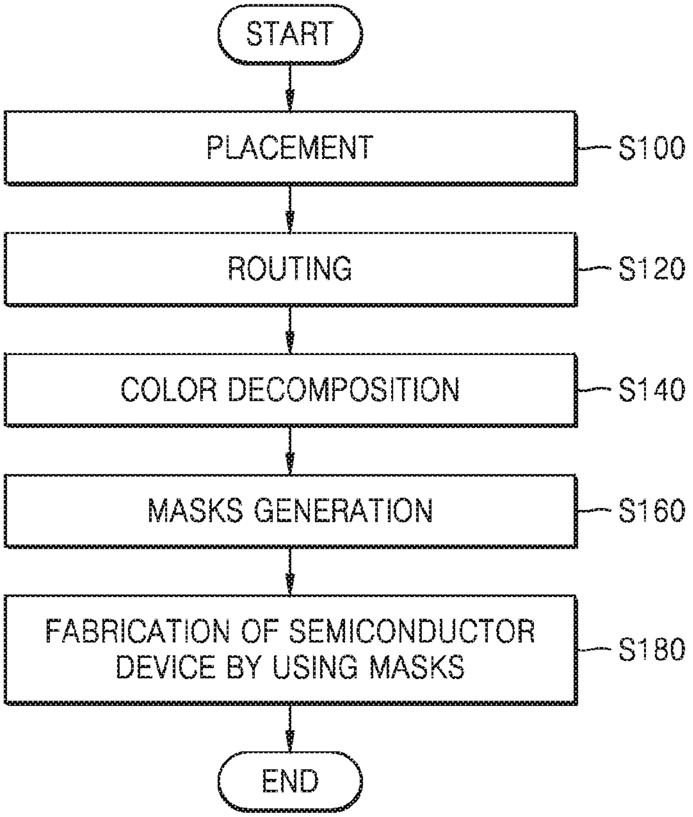
FIG. 1 is a flowchart of a method of manufacturing a semiconductor device according to an exemplary embodiment of the inventive concept.

FIG. 1 is a flowchart of a method of manufacturing a semiconductor device, according to an exemplary embodiment of the inventive concept.

Referring to FIG. 1, in operation S100, standard cells are placed based on design data that defines an integrated circuit (hereinafter, referred to as "design data"). A width of at least one of a first lower pattern and a second lower pattern included in a lower layer of the placed standard cells, may be greater than a width of the other lower pattern included in the lower layer. For example, the lower layer may be a first metal layer. Further, the first and/or second lower pattern may extend in a first direction.

In operation S120, a layout of the integrated circuit may be generated by performing routing with respect to the placed standard cells. For example, the routing may be performed such that vias are arranged on first patterns of the placed standard cells, and second patterns are arranged on the arranged vias. The first patterns may be included in a first layer and the second patterns may be included in a second layer. According to the present embodiment, the vias may be arranged on edge regions of the first patterns, respectively. Accordingly, a space between the second patterns which are arranged on the same track may be equal to or greater than a minimum space between patterns to which different colors are assigned. This feature will be described later with reference to FIGS. 2A through 2C.

In operation S140, color decomposition is performed on a generated layout. In color decomposition, colors are assigned to patterns included in a multiple patterning lithography (MPL) layer. For example, the second layer may be a quadruple patterning lithography (QPL) layer to which QPL is to be applied. In this case, first through fourth colors may be assigned to the second patterns of the second layer. As another example, the second layer may be a triple patterning lithography (TPL) layer to which TPL is to be applied. In this case, first through third colors may be assigned to the second patterns of the second layer.

In operation S160, masks are generated based on the layout on which the color decomposition has been completed. For example, when the second layer is the QPL layer, first through fourth masks corresponding to the first through fourth colors, respectively, may be generated. As another example, when the second layer is the TPL layer, first through third masks corresponding to the first through third colors, respectively, may be generated.

In operation S180, a semiconductor device in which the integrated circuit is implemented is manufactured by using the generated plurality of masks. For example, the semiconductor device is formed by performing various semiconductor processes on a semiconductor substrate, such as a wafer, etc., by using the plurality of masks. For example, the process using the masks may be a patterning process with lithography. In the patterning process, a desired pattern may be formed on the semiconductor substrate or a material layer. In addition, the semiconductor process may include a deposition process, an etching process, an ion process, a cleansing process, etc. In addition, the semiconductor process may include a packaging process including mounting a semiconductor device on a printed circuit board (PCB) and sealing the semiconductor device via a sealing member. In addition, the semiconductor process may include a test process including testing the semiconductor device or the semiconductor package.

Figure 2A:
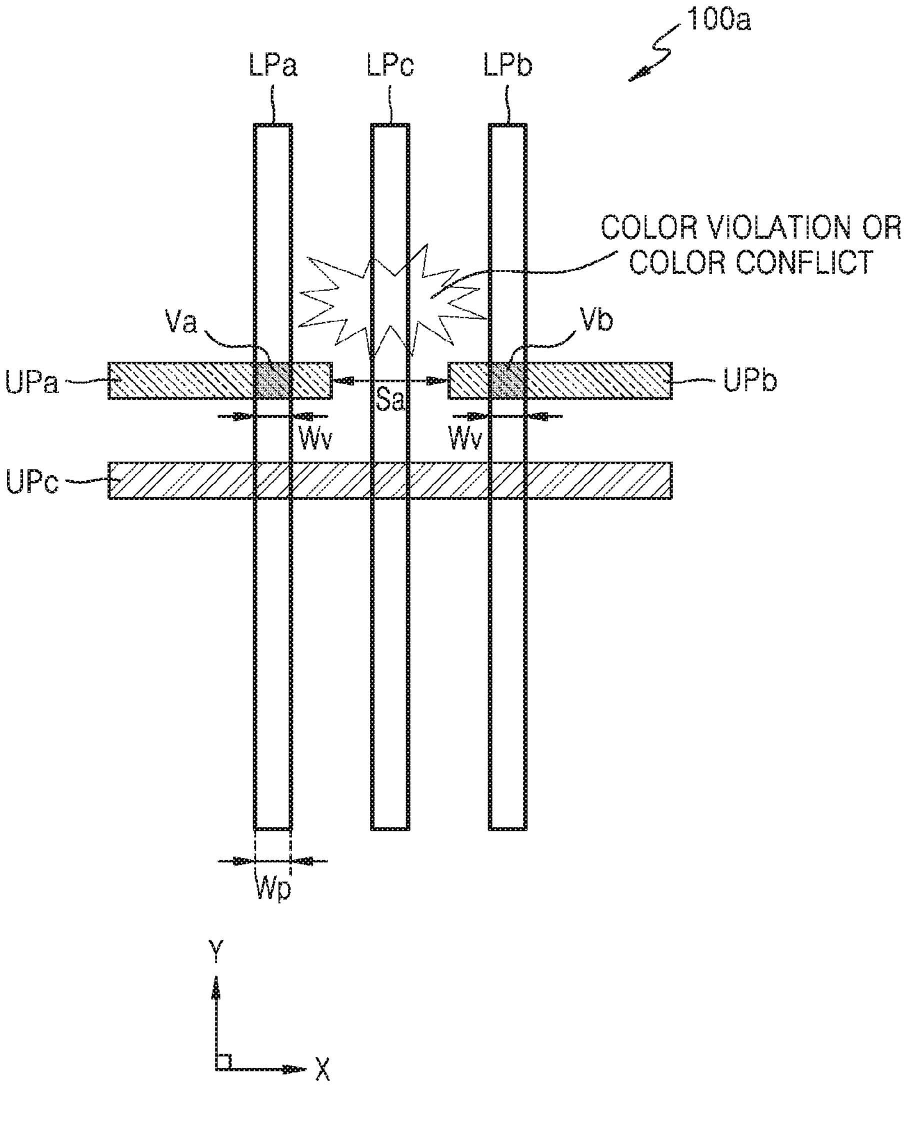
FIG. 2A shows an integrated circuit according to a comparative embodiment.

FIG. 2A shows an integrated circuit 100*a* according to a comparative embodiment.

Referring to FIG. 2A, the integrated circuit 100*a* includes first through third lower patterns LPa through LPc extending in a first direction (for example, a direction Y), first and second vias Va and Vb, and first through third upper patterns UPa through UPc extending in a second direction (for example, a direction X) perpendicular to the first direction. The first and second vias Va and Vb are arranged on the first and second lower patterns LPa and LPb, respectively, and the first and second upper patterns UPa and UPb are arranged on the first and second vias Va and Vb, respectively. A width Wp of the first through third lower patterns LPa through LPc and a width Wv of the first and second vias Va and Vb are the same. The first via Va and the first lower pattern LPa are aligned with each other, and the second via Vb and the second lower pattern LPb are aligned with each other.

For example, a space Sa between the first and second upper patterns UPa and UPb may be less than a minimum space between patterns to which the same color is assigned. Here, when the same color is assigned to the first and second upper patterns UPa and UPb, a color violation or a color conflict may occur between the first and second upper patterns UPa and UPb. Thus, to assign the same color to the first and second upper patterns UPa and UPb, the space Sa between the first and second upper patterns UPa and UPb needs to be increased, and thus, an area of the integrated circuit 100*a* in the second direction X may be increased.

As another example, the space Sa between the first and second upper patterns UPa and UPb may be less than a minimum space between patterns to which different colors are assigned. Here, even when different colors are assigned to the first and second upper patterns UPa and UPb, a color violation may occur between the first and second upper patterns UPa and UPb. Thus, even when different colors are assigned to the first and second upper patterns UPa and UPb, the space Sa between the first and second upper patterns UPa and UPb needs to be increased, and thus, the area of the integrated circuit 100*a* in the second direction X may be increased.

Figure 2B:
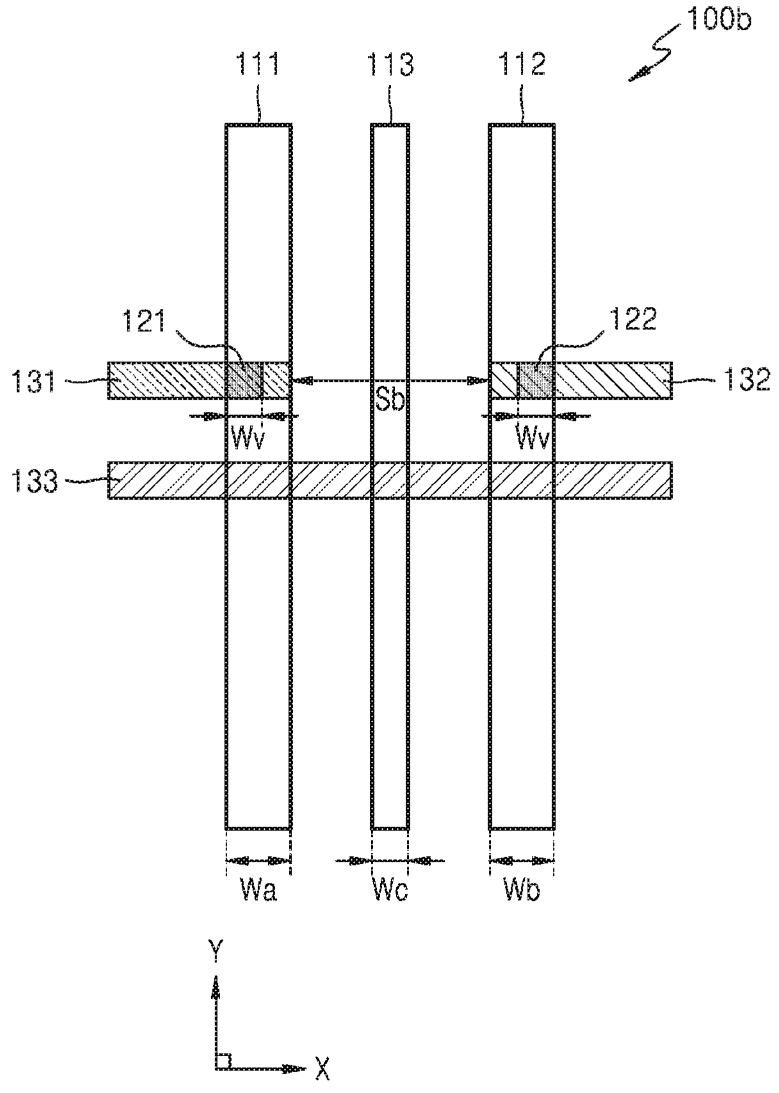
FIGS. 2B and 2C show integrated circuits according to exemplary embodiments of the inventive concept.

FIG. 2B shows an integrated circuit 100*b* according to an exemplary embodiment of the inventive concept.

Referring to FIG. 2B, the integrated circuit 100*b* may include a lower layer including first through third lower patterns 111 through 113, first and second vias 121 and 122, and an upper layer including first through third upper patterns 131 through 133. The first through third lower patterns 111 through 113 may extend in a first direction (for example, a direction Y), and the first through third upper patterns 131 through 133 may extend in a second direction (for example, a direction X) perpendicular to the first direction.

A length of an edge of each pattern in a width direction may be a "width." For example, a length of an edge of each of the first through third lower patterns 111 through 113 in the second direction may be a "width," and the first through third lower patterns 111 through 113 have first through third widths Wa through Wc, respectively. The first and second widths Wa and Wb may be greater than the third width Wc, and thus, the first and second lower patterns 111 and 112 may be referred to as "wide patterns." According to an exemplary embodiment of the inventive concept, the first and second widths Wa and Wb may be the same. According to an exemplary embodiment of the inventive concept, the first and second widths Wa and Wb may be different from each other. According to an exemplary embodiment of the inventive concept, the third width Wc may be the same as the width Wp of FIG. 2A. According to an exemplary embodiment of the inventive concept, the third width Wc may be different from the width Wp of FIG. 2A.

The first via 121 may not be aligned with a center of the first lower pattern 111. For example, the first via 121 may be arranged on an edge region of the first lower pattern 111. Here, the edge region may correspond to a region adjacent to an edge of the first lower pattern that extends in the first direction, the edge being far from the second lower pattern 112. The second via 122 may not be aligned with a center of the second lower pattern 112. For example, the second via 122 may be arranged on an edge region of the second lower pattern 112. Here, the edge region may correspond to a region adjacent to an edge of the second lower pattern 112 that extends in the first direction, the edge being far from the first lower pattern 111. The first and second vias 121 and 122 may have via widths Wv in the second direction X, and the via widths Wv may be less than the first and second widths Wa and Wb. According to an exemplary embodiment of the inventive concept, the first and second vias 121 and 122 may be arranged in a routing operation.

The first upper pattern 131 may be arranged on the first via 121, and the second upper pattern 132 may be arranged on the second via 122. The first and second upper patterns 131 and 132 may be arranged on the same track and adjacent to each other in the second direction X. The third upper pattern 133 may be adjacent to the first and second upper patterns 131 and 132 in the first direction Y. According to an exemplary embodiment of the inventive concept, the first through third upper patterns 131 through 133 may be arranged in the routing operation.

According to the present embodiment, the first and second lower patterns 111 and 112 may be the wide patterns having the first and second widths Wa and Wb that are relatively great. For example, the first and second widths Wa and Wb may be greater than the via width Wv. Accordingly, to increase a space Sb between the first and second upper patterns 131 and 132, the first and second vias 121 and 122 may be arranged on the edge regions of the first and second lower patterns 111 and 112, respectively.

According to an exemplary embodiment of the inventive concept, a first color corresponding to a first mask may be assigned to the first upper pattern 131, and a second color corresponding to a second mask may be assigned to the second upper pattern 132. Here, the space Sb between the first and second upper patterns 131 and 132 may be equal to or greater than a minimum space between patterns to which different colors are assigned, and thus, a color violation may not occur between the first and second upper patterns 131 and 132. However, the present inventive concept is not limited thereto. In exemplary embodiments of the inventive concept, when the space Sb between the first and second upper patterns 131 and 132 is equal to or greater than a minimum space between patterns to which the same color is assigned, the same color may be assigned to the first and second upper patterns 131 and 132.

Figure 2C:
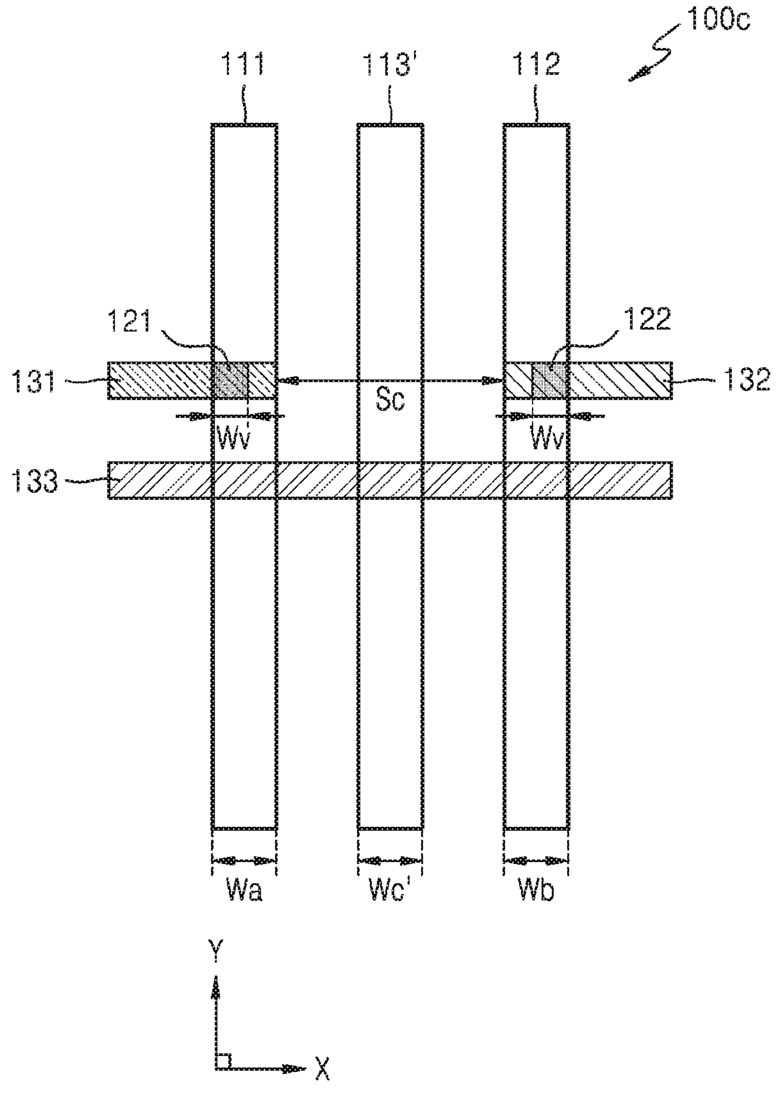

FIG. 2C shows an integrated circuit 100*c* according to an exemplary embodiment of the inventive concept.

Referring to FIG. 2C, the integrated circuit 100*c* may include a lower layer including first through third lower patterns 111, 112, and 113', the first and second vias 121 and 122, and an upper layer including first through third upper patterns 131 through 133. The integrated circuit 100*c* may correspond to a modified embodiment of the integrated circuit 100*b* of FIG. 2B, and thus, the same description will not be repeated. The integrated circuit 100*c* may include the third lower pattern 113' rather than the third lower pattern 113 of FIG. 2B. The third lower pattern 113' may have a third width Wc' in the second direction X, and the third width Wc' may be greater than the third width Wc of FIG. 2B. Thus, all of the first through third lower patterns 111, 112, and 113' may be wide patterns. According to an exemplary embodiment of the inventive concept, the first through third widths Wa, Wb, and Wc' may be the same. According to an exemplary embodiment of the inventive concept, at least two of the first through third widths Wa, Wb, and Wc' may be different from each other. According to the present embodiment, a space Sc between the first and second upper patterns 131 and 132 may be greater than the space Sb of FIG. 2B.

Figure 3:
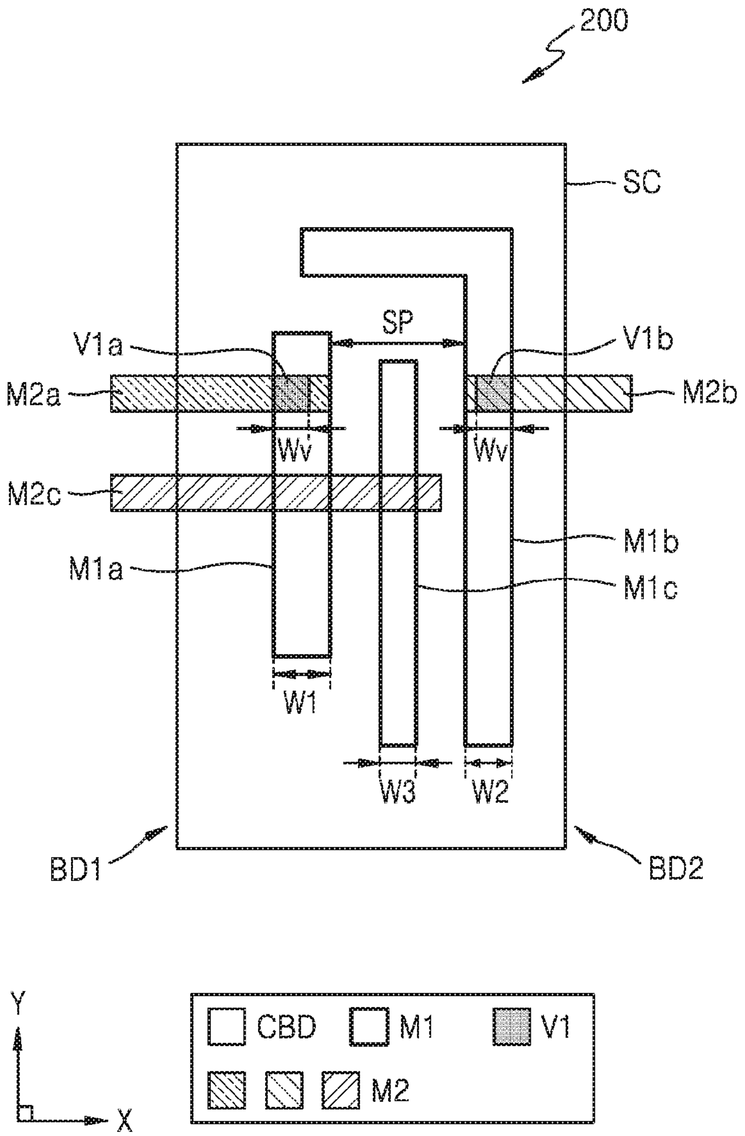
FIG. 3 shows an integrated circuit according to an exemplary embodiment of the inventive concept.

FIG. 3 shows an integrated circuit 200 according to an exemplary embodiment of the inventive concept. For example, the integrated circuit 200 may be an example of the result of operation S140 (color decomposition) of FIG. 1.

Referring to FIG. 3, the integrated circuit 200 may include a lower layer M1 including first through third lower patterns M1*a* through M1*c*, first and second vias V1*a* and V1*b*, and an upper layer M2 including first through third upper patterns M2*a* through M2*c*. The lower layer M1 may be an example of the lower layer of FIG. 2B. For example, the lower layer M1 may correspond to a first metal layer (or may be referred to as "a first wiring layer") on a gate electrode or an active region. The upper layer M2 may be an example of the upper layer of FIG. 2B. For example, the upper layer M2 may correspond to a second metal layer (or may be referred to as "a second wiring layer") on the first metal layer. Hereinafter, the present inventive concept will be described with reference to an embodiment in which the lower layer M1 is the first metal layer and the upper layer M2 is the second metal layer. However, the present inventive concept is not limited thereto, and the upper layer M2 may be a wiring layer arranged via a routing operation.

At least some of the first through third lower patterns M1*a* through M1*c* may extend in a first direction (for example, a direction Y). For example, the first and third lower patterns M1*a* and M1*c* may extend in the first direction Y, and the second lower pattern M1*b* may have a portion extending in the first direction Y and a portion extending in a second direction (for example, a direction X) perpendicular to the first direction. A length of the first through third lower patterns M1*a* through M1*c* in the second direction X will be referred to as a width. The first through third lower patterns M1*a* through M1*c* have first through third widths W1 through W3, respectively.

According to an exemplary embodiment of the inventive concept, the first through third lower patterns M1*a* through M1*c* may be pre-defined in a standard cell SC. The standard cell SC may be defined by a cell boundary CBD, and the cell boundary CBD may include first and second boundaries BD1 and BD2 extending in the first direction Y. However, the present inventive concept is not limited thereto. The first through third lower patterns M1*a* through M1*c* may be changed in a placement operation (S100) and a routing operation (S120). For example, at least one of the first through third widths W1 through W3 may be changed in the placement operation and the routing operation.

According to an exemplary embodiment of the inventive concept, the first width W1 may be greater than the second width W2, and the second width W2 may be greater than the third width W3. However, the present inventive concept is not limited thereto. In exemplary embodiments of the inventive concept, the first and second widths W1 and W2 may be the same, and may be greater than the third width W3. In exemplary embodiments of the inventive concept, the first and second widths W1 and W2 may be different from each other, and may be greater than the third width W3. In exemplary embodiments of the inventive concept, the first through third widths W1 through W3 may be the same, and may be greater than a width of lower patterns included in the lower layer M1 of another standard cell placed to be adjacent to the standard cell SC.

The first via V1*a* may be arranged on the first lower pattern M1*a* and the second via V1*b* may be arranged on the second lower pattern M1*b*. The first via V1*a* may be arranged in an edge region of the first lower pattern M1*a*, the edge region being adjacent to the first boundary BD1. The second via V1*b* may be arranged in an edge region of the second lower pattern M1*b*, the edge region being adjacent to the second boundary BD2. The first and second vias V1*a* and V1*b* may have a via width Wv in the second direction X, and the via width Wv may be less than the first and second widths W1 and W2. According to an exemplary embodiment of the inventive concept, the first and second vias V1*a* and V1*b* may be arranged on the standard cell SC in a routing operation.

The first upper pattern M2*a* may be arranged on the first via V1*a* and the second upper pattern M2*b* may be arranged on the second via V1*b*. The first and second upper patterns M2*a* and M2*b* may be arranged on the same track and may be adjacent to each other in the second direction X. The third upper pattern M2*c* may be adjacent to the first upper pattern M2*a* in the first direction Y. According to an exemplary embodiment of the inventive concept, the first through third upper patterns M2*a* through M2*c* may be arranged on the standard cell SC in the routing operation.

FIG. 3 illustrates that an end of the first upper pattern M2*a* corresponds to an edge of the first lower pattern M1*a*, the edge being close to the second boundary BD2, and an end of the second upper pattern M2*b* corresponds to an edge of the second lower pattern M1*b*, the edge being close to the first boundary BD1. However, this is merely exemplary, and the present inventive concept is not limited thereto. In exemplary embodiments of the inventive concept, the end of the first upper pattern M2*a* may extend further toward the second boundary BD2 beyond the edge of the first lower pattern M1*a*, and the end of the second upper pattern M2*b* may extend further toward the first boundary BD1 beyond the edge of the second lower pattern M1*b*.

According to an exemplary embodiment of the inventive concept, a first color corresponding to a first mask may be assigned to the first upper pattern M2*a*, and a second color corresponding to a second mask may be assigned to the second upper pattern M2*b*. Here, a space SP between the first and second upper patterns M2*a* and M2*b* may be equal to or greater than a minimum space between patterns to which different colors are assigned, and thus, a color violation may not occur between the first and second upper patterns M2*a* and M2*b*. However, the present inventive concept is not limited thereto. In exemplary embodiments of the inventive concept, when the space SP between the first and second upper patterns M2*a* and M2*b* is equal to or greater than a minimum space between patterns to which the same color is assigned, the same color may be assigned to the first and second upper patterns M2*a* and M2*b*.

Figure 4A:
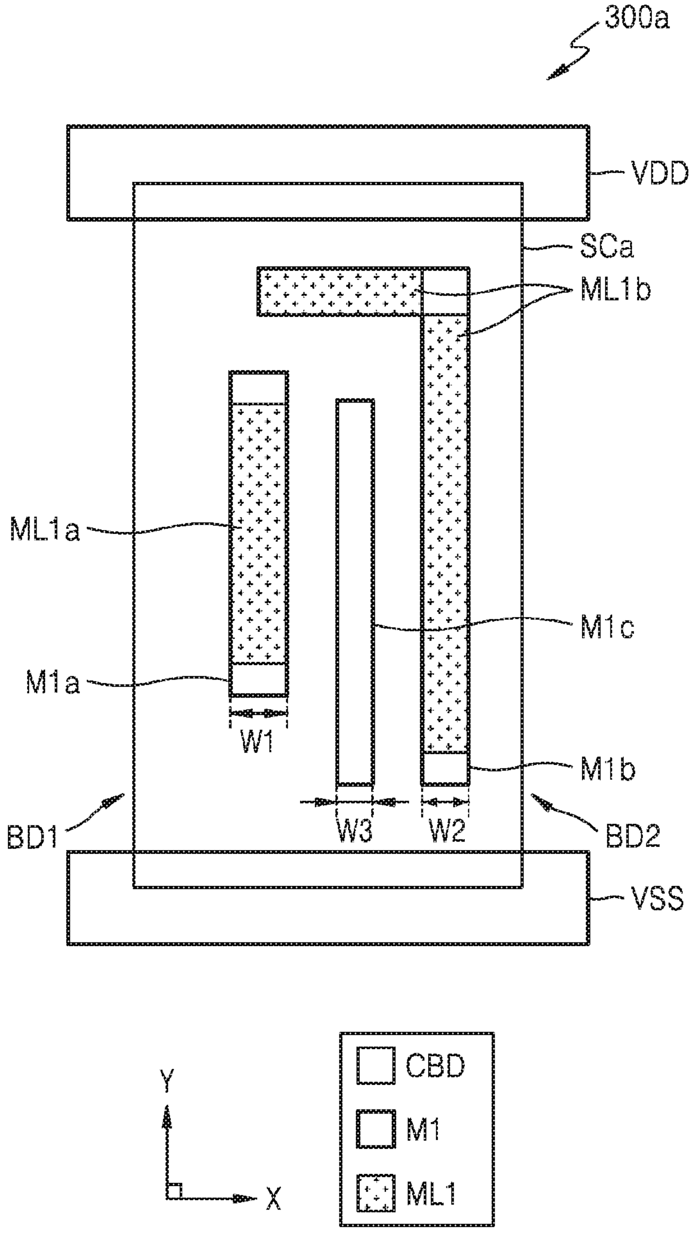
FIGS. 4A, 4B and 4C show integrated circuits including a layer for marking a location of lower patterns, on which a via may be arranged, according to an exemplary embodiment of the inventive concept.
Figure 4B:
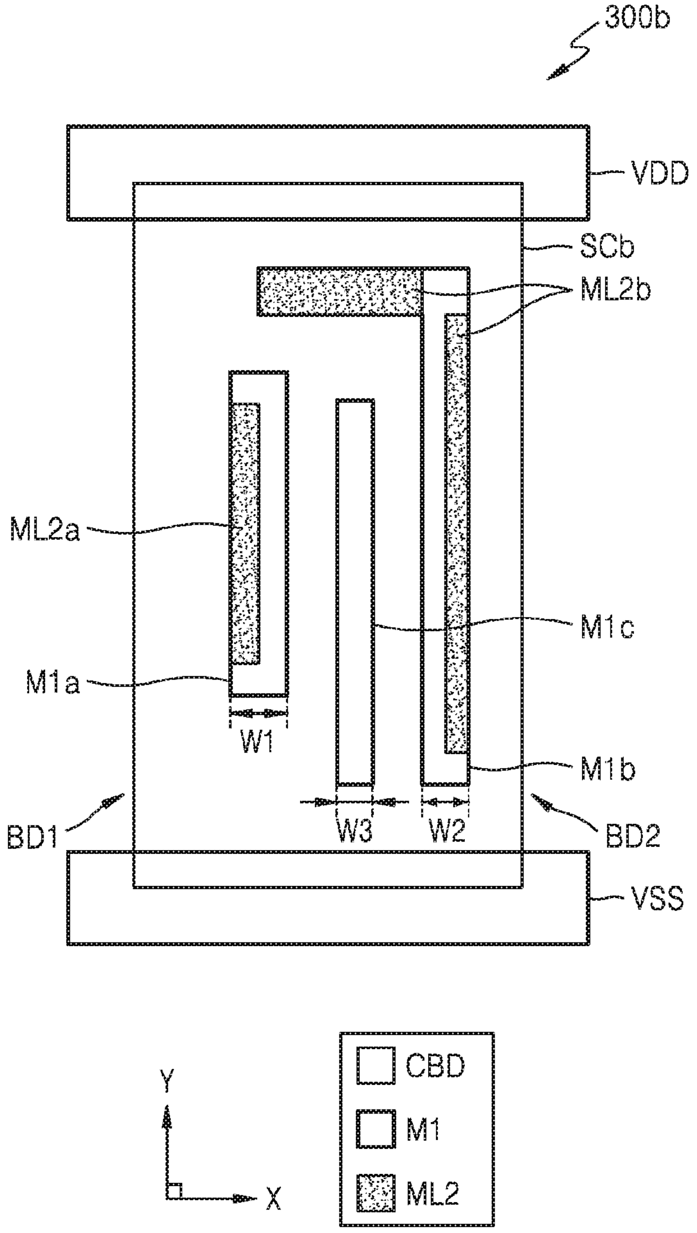
Figure 4C:
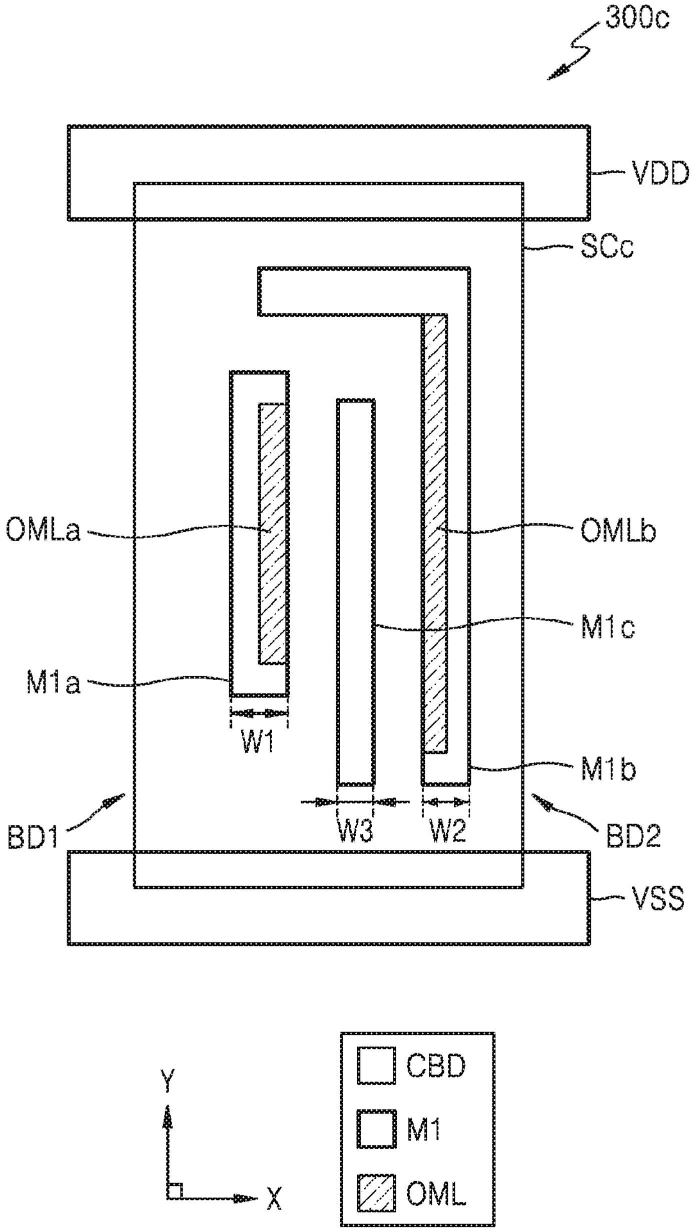

FIGS. 4A through 4C show integrated circuits 300*a* through 300*c* including a layer for marking a location of the first and second lower patterns M1*a* and M1*b*, on which a via may be arranged, according to an exemplary embodiment of the inventive concept. For example, the integrated circuits 300*a* through 300*c* may be examples of the result of operation S100 (placement) of FIG. 1.

Referring to FIG. 4A, the integrated circuit 300*a* may include a standard cell SCa, and the standard cell SCa may include the first through third lower patterns M1*a* through M1*c*. In addition, the integrated circuit 300*a* may further include a power voltage line VDD and a ground voltage line VSS, and the power voltage line VDD and the ground voltage line VSS may be formed in the same layer as the first through third lower patterns M1*a* through M1*c*. The standard cell SCa may further include a first marking layer ML1*a* for marking a location of the first lower pattern M1*a*, on which a via (for example, the via V1*a* of FIG. 3) may be arranged, and a second marking layer ML1*b* for marking a location of the second lower pattern M1*b*, on which a via (for example, the via V1*b* of FIG. 3) may be arranged.

The first marking layer ML1*a* may be generated on the first lower pattern M1*a* to extend in the first direction Y, and a width of the first marking layer ML1*a* in the second direction X may be substantially the same as the first width W1. The second marking layer ML1*b* may be generated on the second lower pattern M1*b* to have a portion extending in the first direction Y and a portion extending in the second direction X. Here, a width of the portion extending in the first direction Y may be substantially the same as the second width W2. When a mask is manufactured based on the first lower pattern M1*a*, a first lower pattern on an actual mask may have two rounded ends, unlike the first lower pattern M1*a* in the layout. The rounded ends may be due to a optical proximity effect. Thus, the first marking layer ML1*a* may be formed to be shorter than the first lower pattern M1*a*. In this case, the via is not located at both ends of the first lower pattern M1*a*.

Referring to FIG. 4B, the integrated circuit 300*b* may correspond to a modified embodiment of FIG. 4A, and a standard cell SCb may include first and second marking layers ML2*a* and ML2*b* rather than the first and second marking layers ML1*a* and ML1*b* of FIG. 4A. The first marking layer ML2*a* may mark a region of the first lower pattern M1*a*, on which the via (for example, the via V1*a* of FIG. 3) is preferentially arranged, and the second marking layer ML2*b* may mark a region of the second lower pattern M1*b*, on which the via (for example, the via V1*b* of FIG. 3) is preferentially arranged.

The first marking layer ML2*a* may be generated on a left edge region of the first lower pattern M1*a*, the left edge region being close to the first boundary BD1. The first marking layer ML2*a* may extend in the first direction Y. A width of the first marking layer ML2*a* in the second direction X may be less than the first width W1. The second marking layer ML2*b* may include a portion extending in the first direction Y and a portion extending in the second direction X. The portion of the second marking layer ML2*b* extending in the first direction Y may be generated on a right edge region of the second lower pattern M1*b*, the right edge region being close to the second boundary BD2. A width of the portion of the second marking layer ML2*b* extending in the first direction Y may be less than the second width W2.

Referring to FIG. 4C, the integrated circuit 300*c* may correspond to a modified embodiment of FIG. 4A, and a standard cell SCc may include first and second obstacle marking layers OMLa and OMLb rather than the first and second marking layers ML1*a* and ML1*b* of FIG. 4A. The first obstacle marking layer OMLa may mark a via arrangement prohibition region on the first lower pattern M1*a*, and the second obstacle marking layer OMLb may mark a via arrangement prohibition region on the second lower pattern M1*b*.

The first obstacle marking layer OMLa may be generated on a right edge region of the first lower pattern M1*a*, the right edge region being far from the first boundary BD1. The first obstacle marking layer OMLa may extend in the first direction Y. A width of the first obstacle marking layer OMLa in the second direction X may be less than the first width W1. The second obstacle marking layer OMLb may be generated on a left edge region of the second lower pattern M1*b*, the left edge region being far from the second boundary BD2. The second obstacle marking layer OMLb may extend in the first direction Y. A width of the second obstacle marking layer OMLb in the second direction X may be less than the second width W2.

Figure 5A:
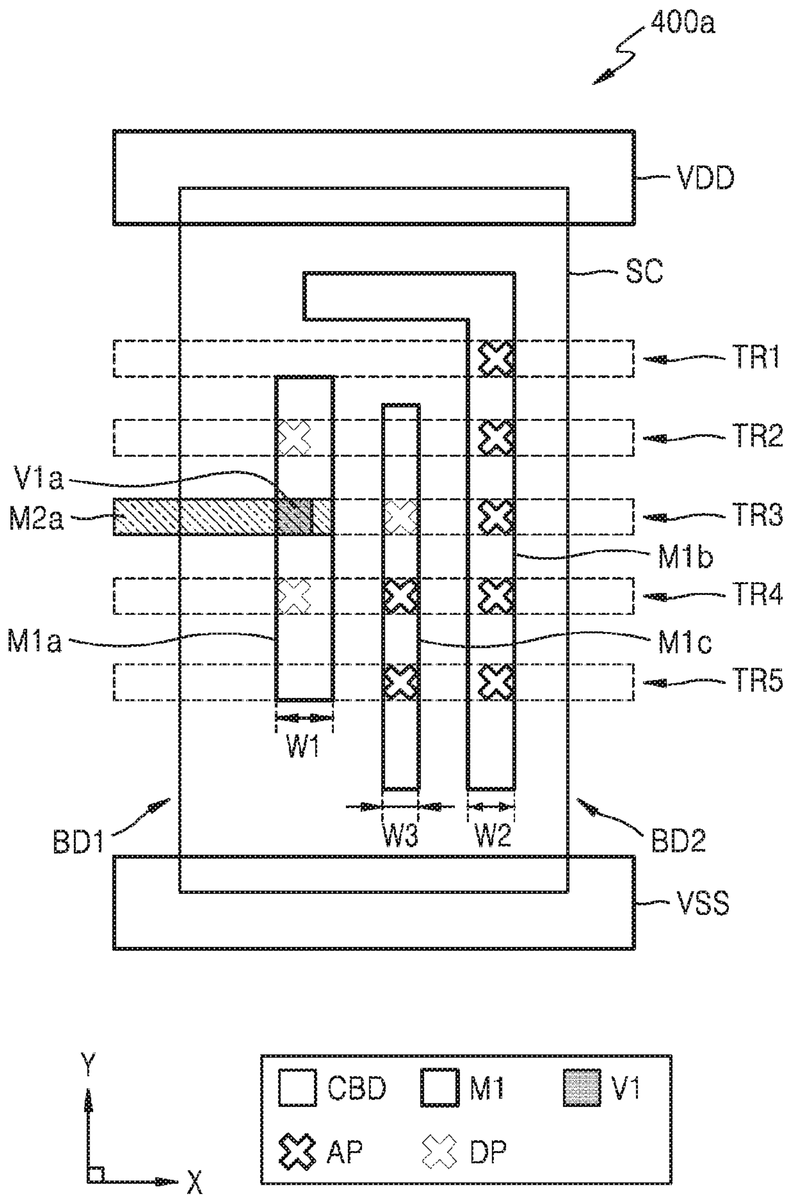
FIGS. 5A, 5B and 5C are layouts for describing a routing operation according to an exemplary embodiment of the inventive concept.
Figure 5B:
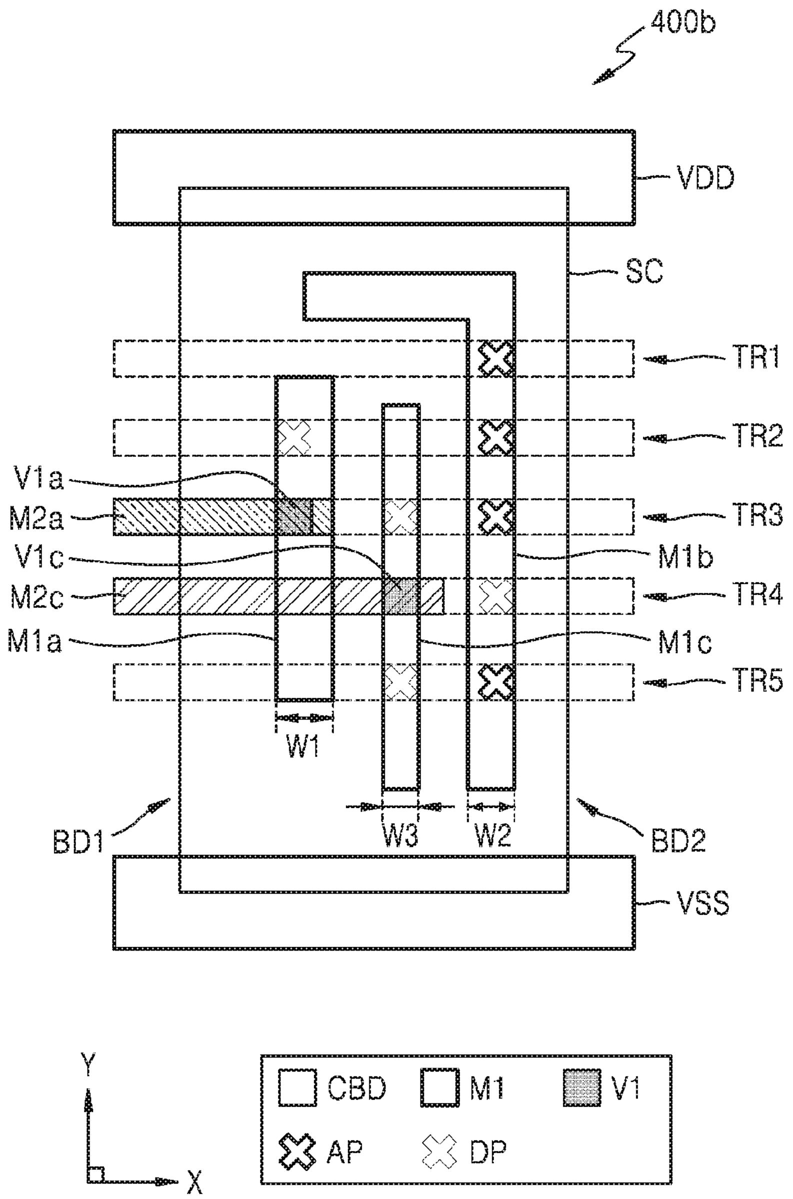
Figure 5C:
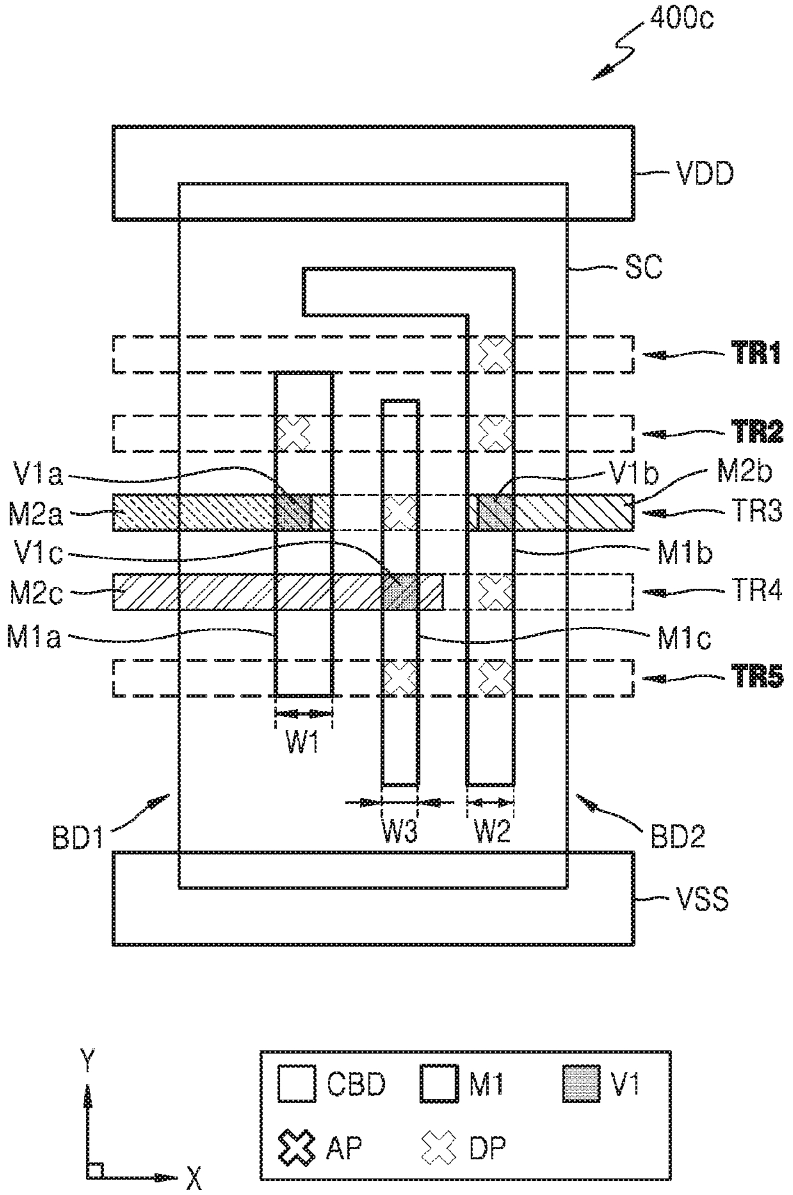

FIGS. 5A through 5C are layouts for describing a routing operation according to an exemplary embodiment of the inventive concept. FIG. 5A shows a routing result with respect to the first lower pattern M1*a*, FIG. 5B shows a routing result with respect to the third lower pattern M1*c*, and FIG. 5C shows a routing result with respect to the second lower pattern M1*b*. According to the present embodiment, the first and second lower patterns M1*a* and M1*b* may be wide patterns, and the first and second vias V1*a* and V1*b* may be arranged on edge regions of the first and second lower patterns M1*a* and M1*b*, respectively.

For example, integrated circuits 400*a* through 400*c* may be examples of the result of operation S120 (routing) of FIG. 1, and may correspond to routing results with respect to the standard cell SC of FIG. 3. Thus, the descriptions given with reference to FIGS. 1 and 3 may be applied to the present embodiment. For example, first through fifth tracks TR1 through TR5 may be located on the standard cell SC. However, the present inventive concept is not limited thereto, and the number of tracks on the standard cell SC may vary. According to the present embodiment, an available pin (AP) indicates a location on which a via may be arranged, and a dead pin (DP) indicates a location on which a via may not be arranged.

In the integrated circuit 400*a*, the first via V1*a* may be arranged on an available pin AP of the third track TR3 from an available pin AP on the first lower pattern M1*a*. The first via V1*a* is arranged on the edge region adjacent to the first boundary BD1, and thus, an end of the first upper pattern M2*a* may be close to the first boundary BD1. Accordingly, in the third track TR3, to obtain a minimum different color space, only an available pin AP on the third lower pattern M1*c* from the second and third lower patterns M1*b* and M1*c* is changed to a dead pin DP. Thus, the number of available pins APs on the third lower pattern M1*c* remaining is two, and the number of available pins APs on the second lower pattern M1*b* is five.

In the integrated circuit 400*b*, a third via V1*c* may be arranged on an available pin AP of the fourth track TR4 from two available pins APs on the third lower pattern M1*c*. Accordingly, in the fourth track TR4, to obtain a minimum different color space, an available pin AP on the second lower pattern M1*b* is changed to a dead pin DP. Thus, the number of available pins APs remaining on the second lower pattern M1*b* is four.

In the integrated circuit 400*c*, the second via V1*b* may be arranged on an available pin AP of the third track TR3 from among four available pins APs on the second lower pattern M1*b*. The second via V1*b* is arranged on the edge region adjacent to the second boundary BD2, and thus, an end of the second upper pattern M2*b* may be close to the second boundary BD2. Thus, a space between the first and second upper patterns M2*a* and M2*b* may be equal to or greater than a minimum different color space. After the arrangement of the first through third vias V1*a* through V1*c*, available routing track resources are three, in other words, the first, second, and fifth tracks TR1, TR2, and TR5, and thus, the degree of freedom of a routing operation may be relatively great.

Figure 6A:
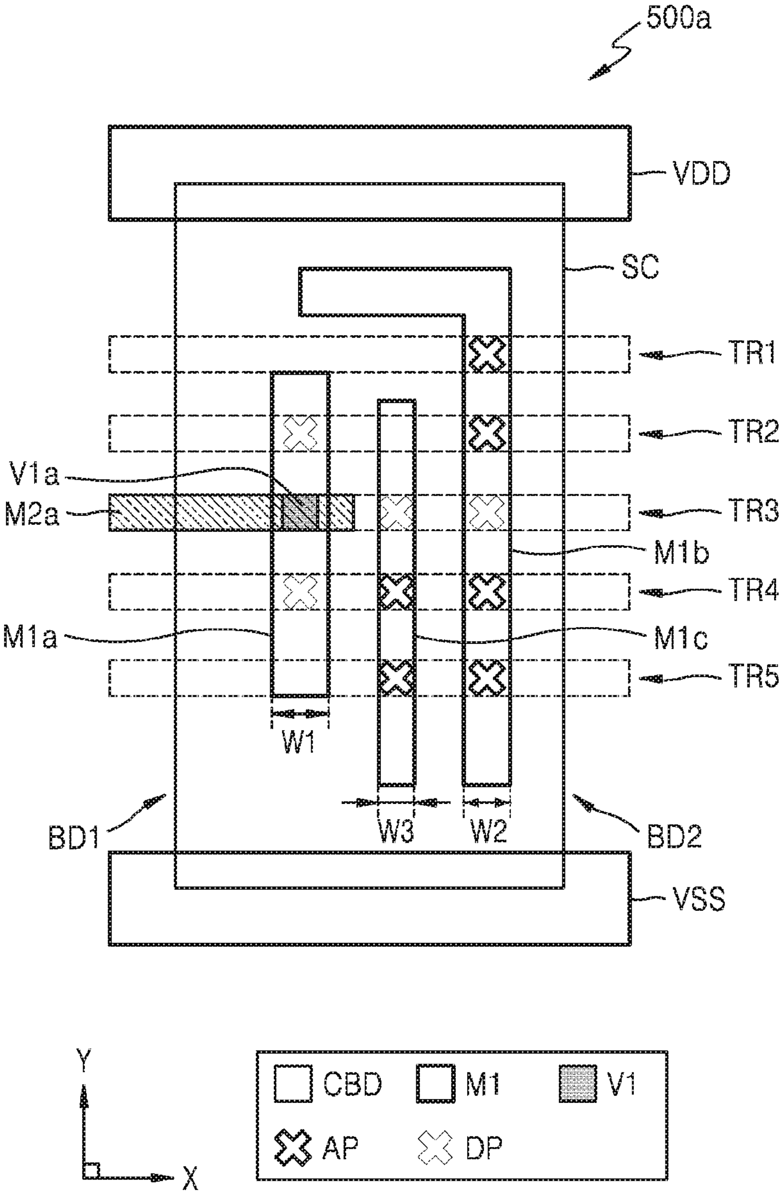
FIGS. 6A, 6B and 6C are layouts for describing a routing operation according to a comparative embodiment.
Figure 6B:
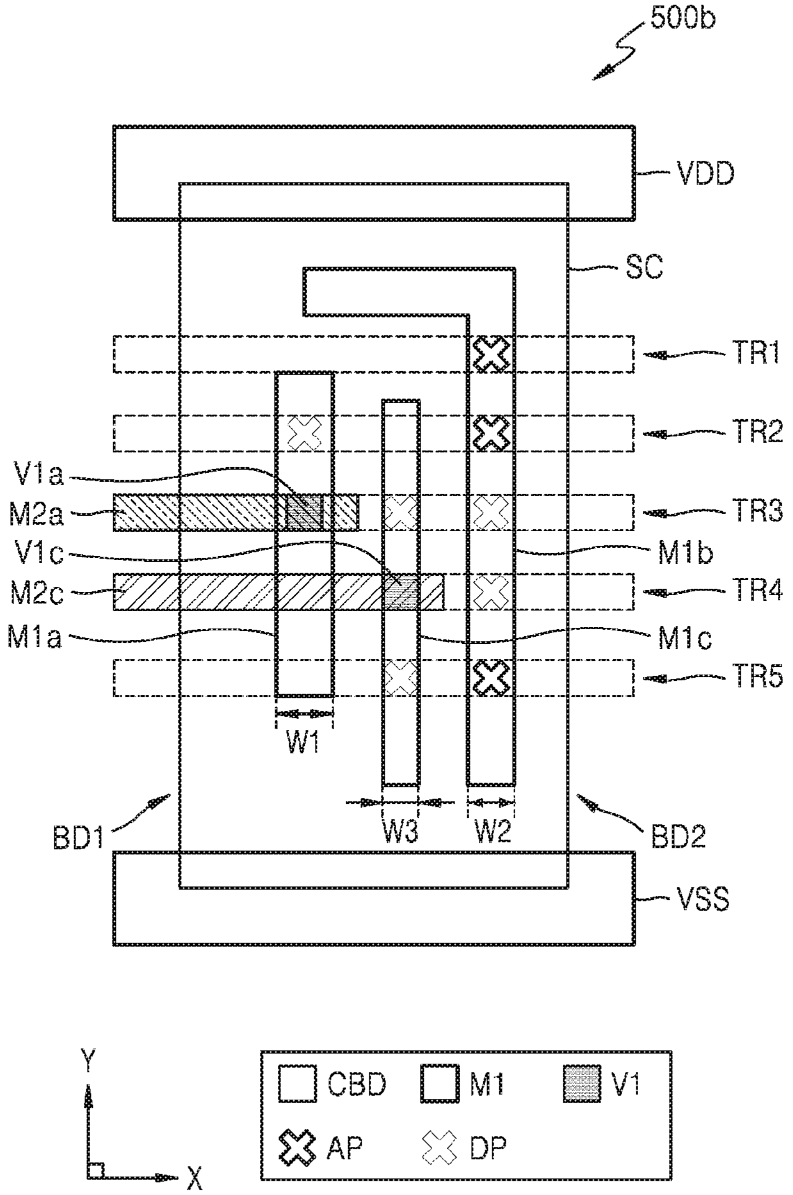
Figure 6C:
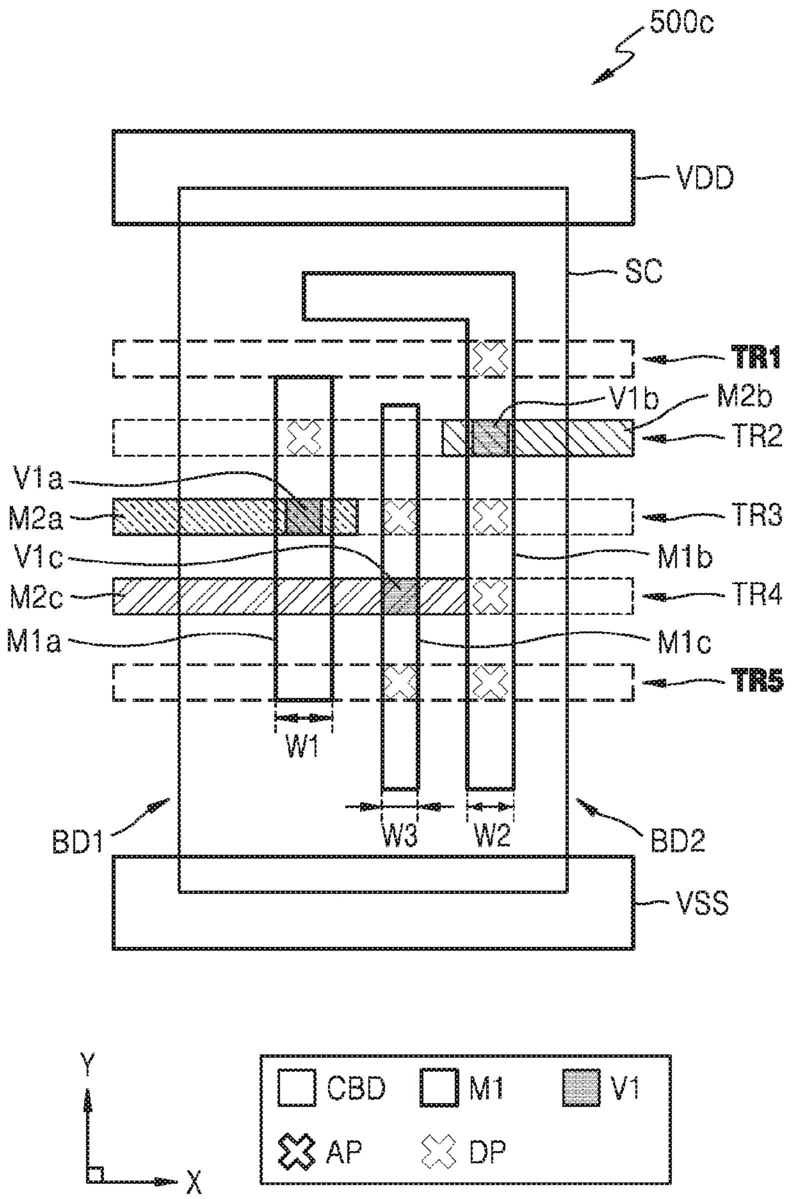

FIGS. 6A through 6C are layouts for describing a routing operation according to a comparative embodiment. FIGS. 6A through 6C show routing results with respect to the first lower pattern M a, the third lower pattern M c, and the second lower pattern M1*b*, respectively. According to the present comparative embodiment, the first and second vias V1*a* and V1*b* may be arranged on central regions of the first and second lower patterns M1*a* and M1*b*, respectively.

In an integrated circuit 500*a*, the first via V1*a* is arranged on an available pin AP of the third track TR3 from available pins APs on the first lower pattern M1*a*. The first via V1*a* is arranged on the central region of the first lower pattern M1*a*, and thus, an end of the first upper pattern M2*a* may be closer to the second boundary BD2, than the case of FIG. 5A. Accordingly, all available pins APs on the second and third lower patterns M1*b* and M1*c* on the third track TR3 are changed to dead pins DPs. Thus, the number of available pins APs on the third lower pattern M1*c* is two, and the number of available pins APs on the second lower pattern M1*b* is four.

In an integrated circuit 500*b*, the third via V1*c* is arranged on an available pin AP of the fourth track TR4 from two available pins APs on the third lower pattern M1*c*, and thus, the available pin AP on the second lower pattern M1*b* on the fourth track TR4 is changed to a dead pin DP. Thus, the number of available pins APs on the second lower pattern M1*b* is three. In an integrated circuit 500*c*, the second via V1*b* is arranged on an available pin AP on the second track TR2 from three available pins APs on the second lower pattern M1*b*. Thus, after the first through third vias V1*a* through V1*c* are arranged, available routing track resources are two, in other words, the first and fifth tracks TR1 and TR5, and thus, the degree of freedom of a routing operation may be relatively less.

Figure 7:
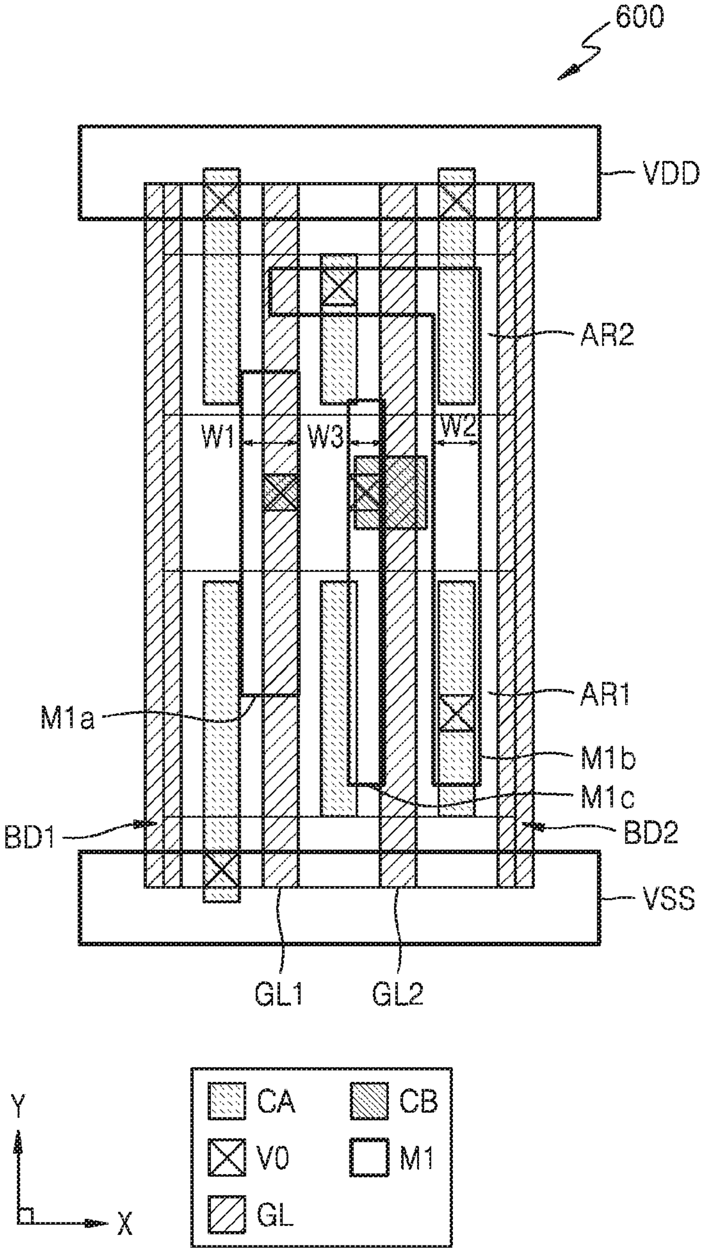
FIG. 7 shows a standard cell according to an exemplary embodiment of the inventive concept.

FIG. 7 shows a standard cell 600 according to an exemplary embodiment of the inventive concept.

Referring to FIG. 7, the standard cell 600 may include first and second active regions AR1 and AR2, first and second gate lines GL1 and GL2, gate contacts CB, source/drain contacts CA, vias V0, and the first through third lower patterns M1*a* through M1*c*. The standard cell 600 according to the present embodiment is a detailed embodiment of the standard cell 200 illustrated in FIG. 3, and thus, the same description will not be repeated.

The first and second active regions AR1 and AR2 may extend in a second direction (for example, a direction X), and may have different conductive types. The first and second active regions AR1 and AR2 may be diffusion regions. Here, a region between the first active region AR1 and the second active region AR2 may be a dummy region or a middle of line (MOL) region. A plurality of active pins extending in the second direction X may be arranged on the first and second active regions AR1 and AR2, and at least one dummy pin extending in the second direction X may be arranged on the dummy region. For example, the active pins arranged on the first active region AR1 may be included in an n-type metal oxide semiconductor (NMOS) transistor, and the active pins arranged on the second active region AR2 may be included in a p-type metal oxide semiconductor (PMOS) transistor. The source/drain contacts CA may be arranged on the first and second active regions AR1 and AR2 to extend in the first direction Y. For example, each of the source/drain contacts CA may be arranged between two adjacent gate lines. Here, the source/drain contacts CA may correspond to source/drain contacts of a semiconductor device.

The first and second gate lines GL1 and GL2 may extend across the first and second active regions AR1 and AR2 in the first direction Y and may be arranged in parallel to each other in the second direction X. The first and second gate lines GL and GL2 may correspond to gate electrodes of the semiconductor device. The gate contacts CB may be arranged on the first and second gate lines GL1 and GL2, respectively, between the first and second active regions AR1 and AR2. Here, the gate contacts CB may correspond to gate contacts of the semiconductor device. The vias V0 may be arranged on the gate contacts CB, respectively. The first through third lower patterns M1*a* through M1*c* may correspond to the first through third lower patterns M1*a* through M1*c* of FIG. 3.

Figure 8:
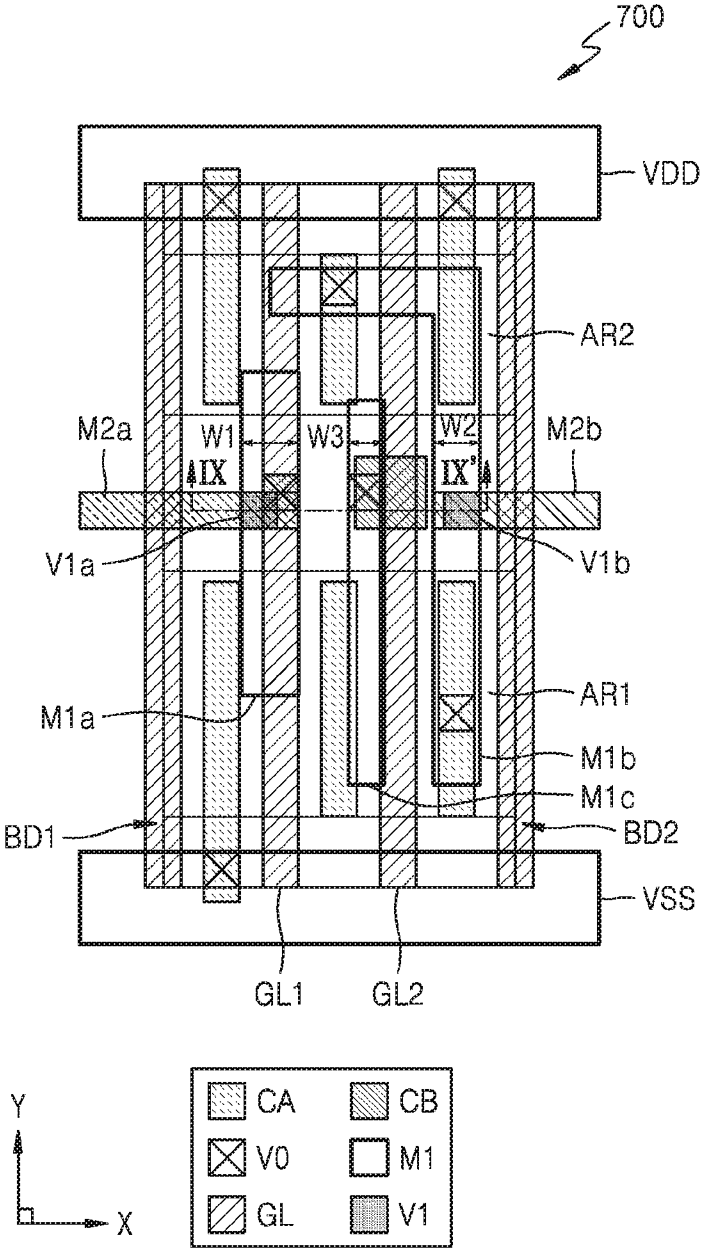
FIG. 8 is an integrated circuit layout according to an exemplary embodiment of the inventive concept.

FIG. 8 is an integrated circuit (IC) layout 700 according to an exemplary embodiment of the inventive concept.

Referring to FIG. 8, the integrated circuit layout 700 may include the first and second active regions AR1 and AR2, the first and second gate lines GL1 and GL2, the gate contacts CB, the source/drain contacts CA, the vias V0, the first through third lower patterns M1*a* through M1*c*, the first and second vias V1*a* and V1*b*, and the first and second upper patterns M2*a* and M2*b*. The IC layout 700 according to the present embodiment is an example of a routing result with respect to the standard cell 600 illustrated in FIG. 7, and thus, the same description will not be repeated.

The integrated circuit layout 700 may be generated by performing a routing operation whereby the first and second vias V1*a* and V1*b* and the first and second upper patterns M2*a* and M2*b* are arranged on the standard cell 600 of FIG. 7. For example, the first via V1*a* may be arranged on a left edge region of the first lower pattern M1*a*, which is adjacent to the first boundary BD1, and the second via V1*b* may be arranged on a right edge region of the second lower pattern M1*b*, which is adjacent to the second boundary BD2. Next, the first upper pattern M2*a* may be arranged on the first via V1*a* and the second upper pattern M2*b* may be arranged on the second via V1*b*.

Figure 9:
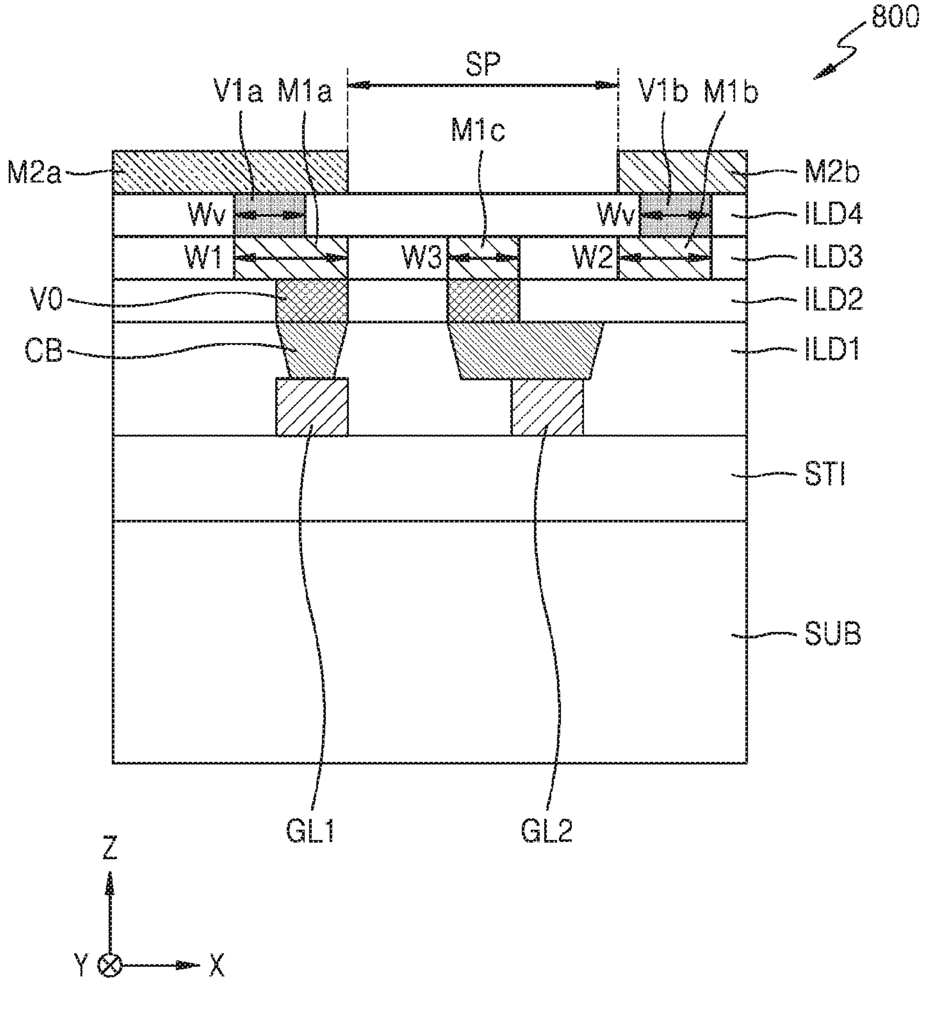
FIG. 9 is a cross-sectional view taken along a line IX-IX' of FIG. 8 according to an exemplary embodiment of the inventive concept.

FIG. 9 is a cross-sectional view taken along a line IX-IX' of FIG. 8, according to an exemplary embodiment of the inventive concept. A semiconductor device 800 illustrated in FIG. 9 may be an example of a semiconductor device manufactured according to the IC layout 700 of FIG. 8.

Referring to FIG. 9, a substrate SUB may be a semiconductor substrate. For example, the semiconductor substrate may be any one of a silicon-on-insulator (SOI) substrate, silicon-on-sapphire, germanium, silicon-germanium, and gallium-arsenide. A device separation layer STI may be arranged on the substrate SUB and a first insulating layer ILD1 may be arranged on the device separation layer STI. The first insulating layer ILD1 may include an insulating material. For example, the insulating material may include any one of an oxide layer, a nitride layer, and an oxynitride layer.

The first and second gate lines GL1 and GL2 may be arranged on the device separation layer STI. The first and second gate lines GL1 and GL2 may include, for example, a metal material, such as tungsten (W) or tantalum (Ta), a nitride thereof, a silicide thereof, doped polysilicon, or the like. For example, the first and second gate lines GL1 and GL2 may be formed by using a deposition process. The gate contacts CB may be arranged on the first and second gate lines GL1 and GL2, respectively, and the vias V0 may be arranged on the gate contacts CB, respectively. The gate contacts CB and the vias V0 may include, for example, a material having electrical conductivity, such as W.

The lower layer M1 including the first through third lower patterns M1*a* through M1*c* may be arranged on a second insulating layer ILD2 and the vias V0. The first width W1 of the first lower pattern M1*a* may be greater than the second width W2 of the second lower pattern M1*b*, and the second width W2 of the second lower pattern M1*b* may be greater than the third width W3 of the third lower pattern M1*c*. Here, the first and second lower patterns M1*a* and M1*b* may be referred to as wide patterns, and the third lower pattern M1*c* may be referred to as a normal pattern.

The first and second vias V1*a* and V1*b* may be arranged on a third insulating layer ILD3 and the lower layer M1. The width Wv of the first via V1*a* may be less than the first width W1, and the first via V1*a* may not be aligned with a center of the first lower pattern M1*a*. For example, the first via V1*a* may be arranged on a left edge region of the first lower pattern M1*a*. The width Wv of the second via V1*b* may be less than the second width W2, and the second via V1*b* may not be aligned with a center of the second lower pattern M1*b*. For example, the second via V1*b* may be arranged on a right edge region of the second lower pattern M1*b*.

The first and second upper patterns M2*a* and M2*b* may be arranged on a fourth insulating layer ILD4 and the first and second vias V1*a* and V1*b*. The first upper pattern M2*a* may be arranged on the first via V a and the second upper pattern M2*b* may be arranged on the second via V1*b*. According to the present embodiment, since the first and second vias V1*a* and V1*b* are respectively arranged on the edge regions of the first and second lower patterns M1*a* and M1*b* which are wide patterns, a distance between the first and second vias V1*a* and V1*b* may increase, compared to a case in which the first and second vias V1*a* and V1*b* are arranged to be aligned to, for example, the centers of normal patterns. Thus, the space SP between the first and second upper patterns M2*a* and M2*b* may be equal to or greater than a different color space, which is a minimum space between patterns to which different colors are assigned.

Figure 10:
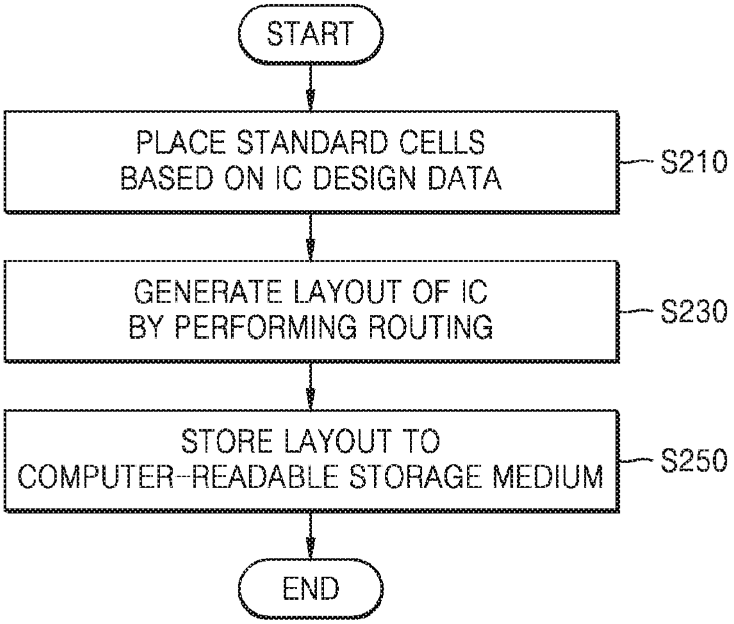
FIG. 10 is a flowchart of a method of designing an integrated circuit, according to an exemplary embodiment of the inventive concept.

FIG. 10 is a flowchart of a method of designing an integrated circuit, according to an exemplary embodiment of the inventive concept.

Referring to FIG. 10, the operation of designing the integrated circuit according to the present embodiment may be performed by using a tool for designing the integrated circuit. Here, the tool for designing the integrated circuit may be a program including a plurality of instructions that are executed by a processor. Accordingly, the method of designing the integrated circuit may be referred to as a computer-implemented method for designing the integrated circuit. Hereinafter, the present embodiment will be described with reference to FIGS. 7, 8, and 10 together.

In operation S210, standard cells including a first standard cell are placed based on IC design data defining the integrated circuit. For example, the first standard cell may be the standard cell 600 of FIG. 7, and a width of at least one of the first and second lower patterns M1*a* and M1*b* of the first standard cell 600 may be greater than a width of a lower pattern of another standard cell from among the arranged standard cells.

In operation S230, a layout of the integrated circuit is generated by performing routing with respect to the placed standard cells. For example, the routing may be performed by arranging the first and second vias V1*a* and V1*b* on the first and second lower patterns M1*a* and M1*b*, and arranging an upper layer including the first and second upper patterns M2*a* and M2*b* on the first and second vias V1*a* and V1*b*. Thus, the integrated circuit layout 700 of FIG. 8 may be generated. For example, operations S210 and S230 may be performed by a processor by using a placement and routing (P&R) tool.

In operation S250, the generated layout is stored to a computer-readable storage medium. Here, the computer-readable storage medium may include any storage medium having data which may be read by a computer during an operation of providing instructions and/or data to the computer. For example, the computer-readable storage medium may include a magnetic or optical medium, such as a disk, a tape, compact disc (CD)-read-only memory (ROM), digital video disc (DVD)-ROM, CD-recordable (R), CD-rewritable (RW), DVD-R, DVD-RW, etc., a volatile or nonvolatile memory, such as random access memory (RAM), ROM, a flash memory, etc., a nonvolatile memory accessible via a universal serial bus (USB) interface, a microelectromechanical system (MEMS), etc. The computer-readable storage medium may be inserted into a computer, integrated into a computer, or coupled to a computer via a communication medium, such as a network and/or a wireless link.

After operation S250, output data defining the integrated circuit, in other words, layout data may be provided to the semiconductor process module. Here, the output data may have a format including all layout information of the standard cells, in other words, pattern information of all layers. For example, the output data may have the graphic design system (GDS) II format. Alternatively, the output data may have a format including external information of the standard cells, such as a pin of the standard cells. For example, the output data may have the Library Exchange Format (LEF) format or the Milkyway format.

Figure 11:
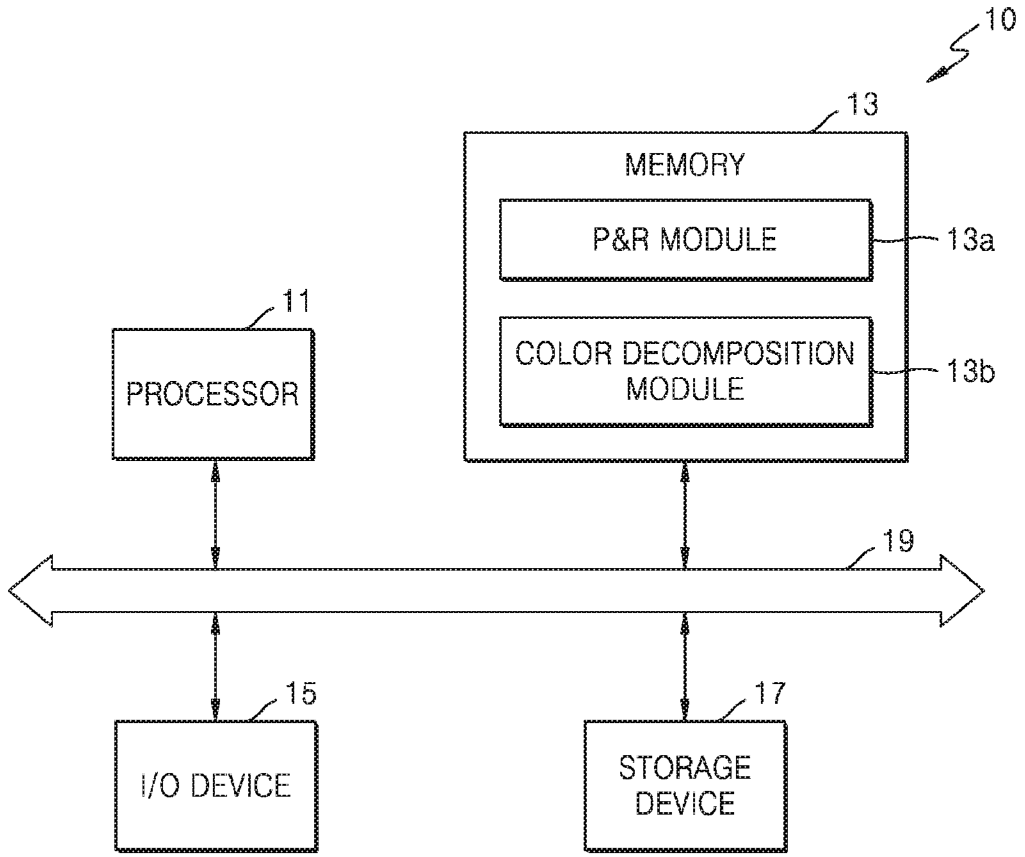
FIG. 11 is a block diagram of a computing system for designing an integrated circuit, according to an exemplary embodiment of the inventive concept.

FIG. 11 is a block diagram of a computing system 10 for designing an integrated circuit, according to an exemplary embodiment of the inventive concept.

Referring to FIG. 11, the computing system 10 for designing an integrated circuit (hereinafter, referred to as an "integrated circuit design system") may include a processor 11, a memory 13, an input/output device 15, a storage device 17, and a bus 19. The integrated circuit design system 10 may perform the method of designing the integrated circuit of FIG. 10. According to the present embodiment, the integrated circuit design system 10 may be implemented as an integrated device, and thus, may also be an integrated circuit design device. The integrated circuit design system 10 may be provided as an exclusive device for designing the integrated circuit of a semiconductor device. However, the integrated circuit design system 10 may be a computer for driving various simulation tools or design tools.

The processor 11 may be configured to execute instructions for performing at least one of various operations for designing the integrated circuit. The processor 11 may communicate, via the bus 19, with the memory 13, the input/output device 15, and the storage device 17. To execute an operation of designing the integrated circuit, the processor 11 may drive a P&R module 13*a* loaded to the memory 13, and to execute a color decomposition operation with respect to patterns included in a layer to which MPL, TPL, or QPL is to be applied, the processor 11 may drive a color decomposition module 13*b* loaded to the memory 13.

The memory 13 may store programs including instructions for performing placement and routing operations for designing the integrated circuit, and for performing the color decomposition operation. According to an exemplary embodiment of the inventive concept, the memory 13 may store the P&R module 13*a* and the color decomposition module 13*b*, and the P&R module 13*a* and the color decomposition module 13*b* may be loaded to the memory 13 from the storage device 17. The P&R module 13*a* may be, for example, a program including instructions for performing the placement operation according to operation S100 of FIG. 1 and for performing the colorless routing operation according to operation S120 of FIG. 1. The color decomposition module 13*b* may be, for example, a program including instructions for performing the color decomposition operation according to operation S140 of FIG. 1. However, the present inventive concept is not limited thereto, and the memory 13 may further store various modules, such as a timing analysis module, a simulation module, etc. The memory 13 may be a volatile memory, such as static random-access memory (SRAM) or dynamic random-access memory (DRAM), or a nonvolatile memory, such as phase-change random-access memory (PRAM), magnetic random-access memory (MRAM), resistive random-access memory (ReRAM), ferroelectric random-access memory (FRAM), a flash memory, etc.

The input/output device 15 may control a user input or an output with respect to user interface devices. For example, the input/output device 15 may include an input device, such as a keyboard, a mouse, a touchpad, etc., and may receive integrated circuit design data. For example, the input/output device 15 may include an output device, such as a display, a speaker, etc., and may display an arrangement result, a wiring result, or a color decomposition result. The storage device 17 may store various data related to the P&R module 13*a* and the color decomposition module 13*b*. The storage device 17 may include a memory card (multimedia card (MMC), embedded multimedia card (eMMC), secure digital (SD), MicroSD, etc.), a solid state drive (SSI)), a hard disk drive (HDD), etc.

Figure 12:
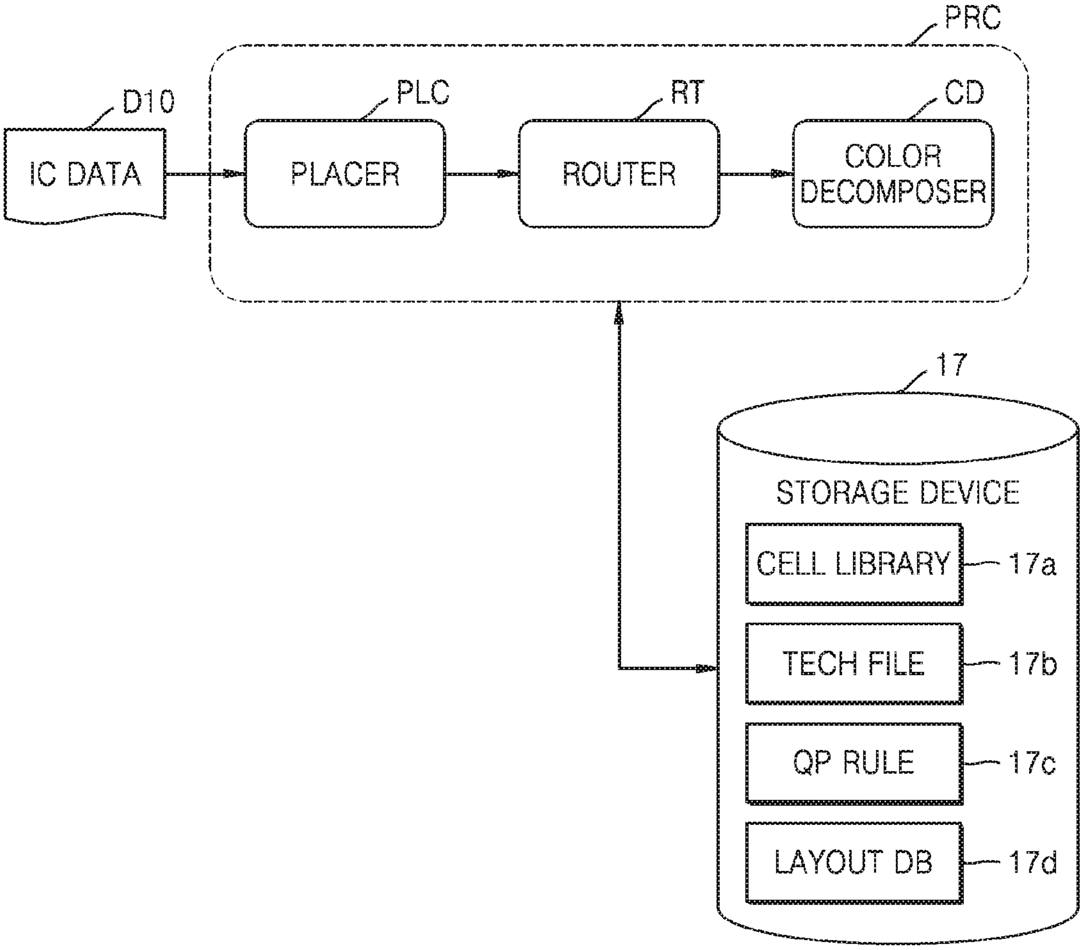
FIG. 12 shows a program stored in a memory of FIG. 11 according to an exemplary embodiment of the inventive concept.

FIG. 12 illustrates a program stored in the memory 13 of FIG. 11, according to an exemplary embodiment of the inventive concept.

Referring to FIG. 12, the program stored in the memory 13 may include a plurality of procedures PRC. Here, the procedures PRC may be a series of instructions for performing specific tasks. The procedures PRC may also be a function, a routine, a subroutine, a subprogram, etc. According to the present embodiment, the procedures PRC may include a placer PLC, a router RT, and a color decomposer CD. The processor 11 of FIG. 11 performing an operation by executing one of the procedures PRC, in other words, PLC, RT, or CD, may also be referred to as the procedures PLC, RT, or CD performing the operation.

The storage device 17 may store a cell library 17*a*, a technology file 17*b*, a quadruple patterning (QP) rule 17*c*, and a layout DB 17*d*. The cell library 17*a* may store information with respect to a standard cell that is necessary to generate a layout of an integrated circuit, and may be a standard cell library. The technology file 17*b* may store rules and materials that are used in a process of manufacturing the integrated circuit. For example, the technology file 17*b* may store a layer definition, a device definition, design rules, etc. The QP rule 17*c* may store a patterning rule with respect to a QPL layer. The layout DB 17*d* may store information with respect to a layout generated in the procedures PRC, for example, physical information about the layout.

The placer PLC may place standard cells based on integrated circuit (IC) design data D10. For example, the placer PLC may perform the placement operation by accessing the cell library 17*a*. The placer PLC may place the standard cells such that a width of at least one of the first and second lower patterns (for example, the lower patterns M1*a* and M1*b* of FIG. 7) included in the lower layer of the placed standard cell, and extending in the first direction, may be greater than a width of the other lower pattern included in the lower layer.

The router RT may generate a layout by performing routing with respect to the standard cells placed by the placer PLC. For example, the router RT may perform routing based on the technology file 17*b*. The router RT may arrange the first and second vias (for example, the first and second vias V1*a* and V1*b* of FIG. 8) on the first and second lower patterns, respectively, and arrange the upper layer including the first and second upper patterns (for example, the first and second upper patterns M2*a* and M2*b* of FIG. 8) arranged on the first and second vias V1*a* and V1*b*, respectively, to be adjacent to be each other in the second direction. In addition, the router RT may arrange the first and second vias V a and V1*b* on edge regions of the first and second lower patterns, respectively, such that a space between the first and second upper patterns increases.

The color decomposer CD may assign first through fourth colors corresponding to first through fourth masks, respectively, to patterns included in a layer to which QPL is to be applied, based on the generated layout. For example, the color decomposer CD may perform color decomposition based on the QP rule 17*c*. According to an exemplary embodiment of the inventive concept, the color decomposer CD may assign the first and second colors respectively to the first and second upper patterns arranged on a first track, and assign the third and fourth colors respectively to the third and fourth upper patterns arranged on a second track.

Figure 13:
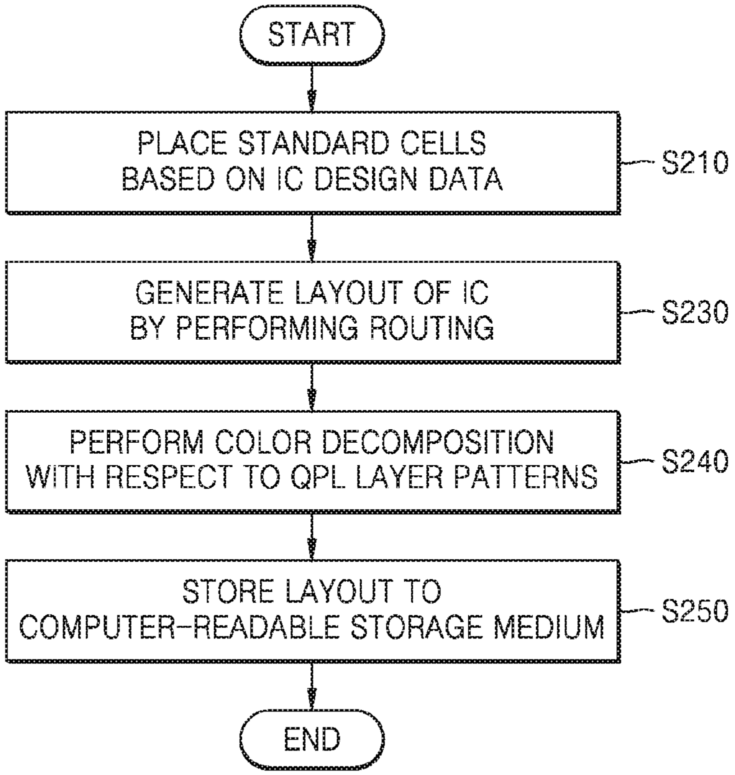
FIG. 13 is a flowchart of a method of designing an integrated circuit, according to an exemplary embodiment of the inventive concept.

FIG. 13 is a flowchart of a method of designing an integrated circuit, according to an exemplary embodiment of the inventive concept.

Referring to FIG. 13, the method of designing the integrated circuit according to the present embodiment may correspond to a modified embodiment of the method illustrated in FIG. 10. For example, as compared with the method illustrated in FIG. 10, the method of FIG. 13 may further include operation S240. In operation S240, color decomposition is performed with respect to patterns included in a layer to which QPL is to be applied, in other words, with respect to QPL layer patterns. For example, operation S240 may be performed by a processor by using a color decomposition tool. For example, the color decomposition may be performed in a data preparation operation. As another example, the color decomposition may also be performed in a design rule check (DRC) operation. However, the present inventive concept is not limited thereto, and the color decomposition may be performed in a routing operation. Operation S240 will be described later with reference to FIGS. 14 through 18.

Figure 14:
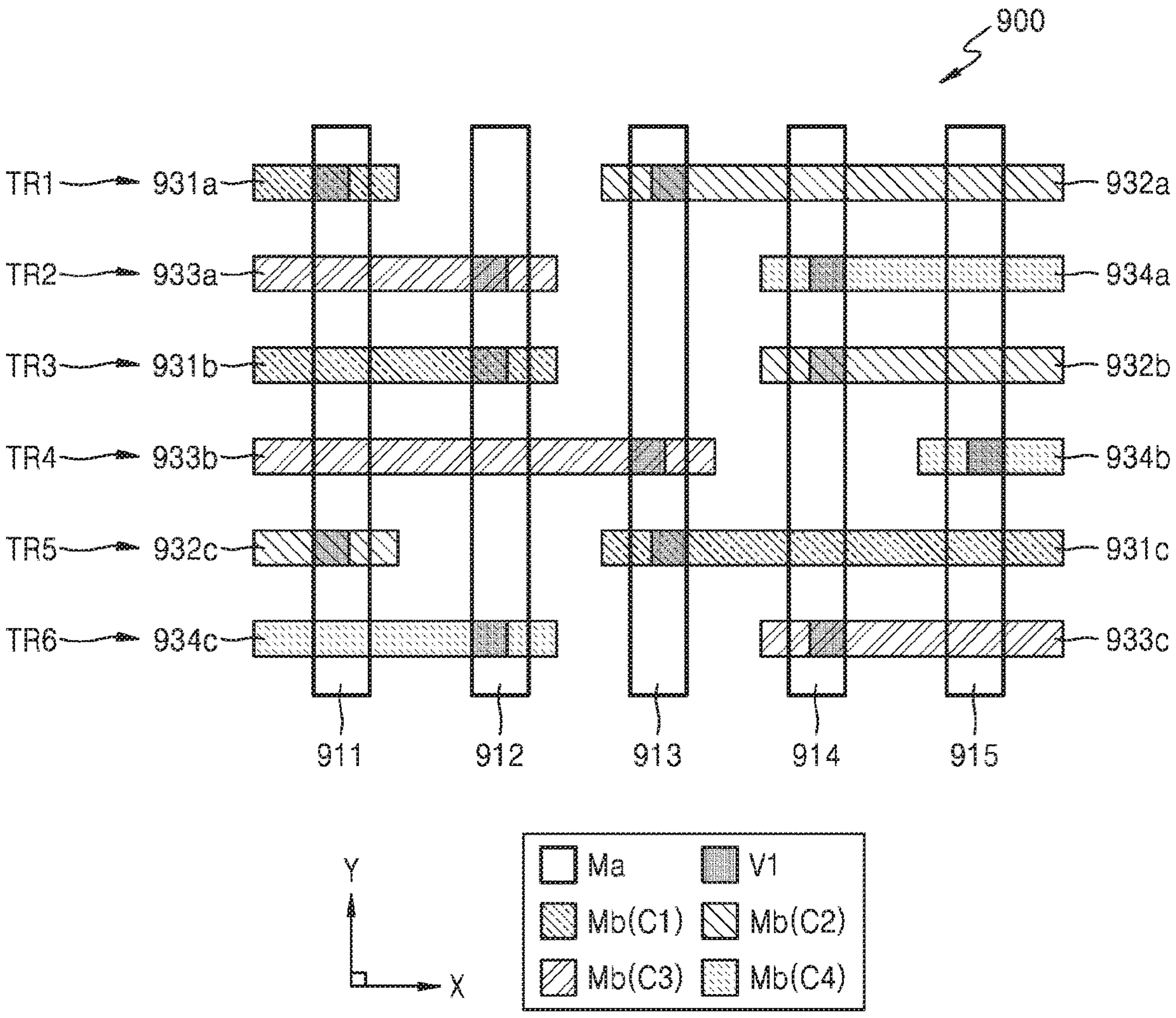
FIG. 14 shows a layout generated by using color decomposition with respect to a quadruple patterning lithography (QPL) layer, according to an exemplary embodiment of the inventive concept.

FIG. 14 shows an example of a layout 900 generated via color decomposition with respect to a QPL layer, according to an exemplary embodiment of the inventive concept.

Referring to FIG. 14, the layout 900 may include a first metal layer Ma including a plurality of first metal patterns 911 through 915 extending in a first direction Y, first vias V1 arranged on the first metal layer Ma, and a second metal layer Mb including a plurality of second metal patterns 931*a* through 934*c* arranged on the first vias V1 and extending in a second direction X.

For example, the first metal layer Ma may correspond to the lower layer M1 of FIG. 8, and the first metal patterns 911 through 913 may correspond to the first through third lower patterns M1*a* through M1*c* of FIG. 8. For example, some of the first vias V1 may correspond to the first and second vias V1*a* and V1*b* of FIG. 8. A width of each of the first metal patterns 911 through 915 may be greater than a width of each of the first vias V1. A center of each of the first vias V1 may not be aligned with a center of each of the first metal patterns 911 through 915, and each of the first vias V1 may be arranged on an edge region of each of the first metal patterns 911 through 915.

For example, the second metal layer Mb may correspond to the upper layer M2 of FIG. 8, and the second metal patterns 931*a* and 932*a* may correspond to the first and second upper patterns M2*a* and M2*b* of FIG. 8. Here, the second metal layer Mb may correspond to a QPL layer to which QPL is to be applied, and first through fourth colors C1 through C4 may be assigned to the second metal patterns 931*a* through 934*c*. Various examples of a color decomposition operation with respect to the second metal patterns 931*a* through 934*c* will be described in more detail with reference to FIGS. 15, 17, and 18.

Figure 15:
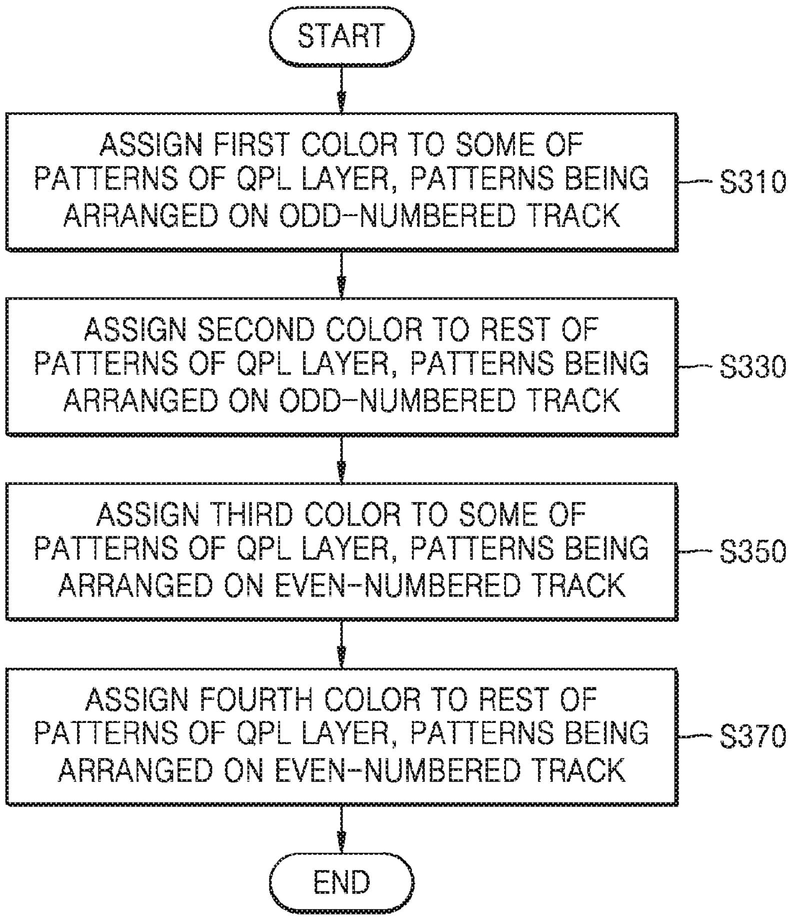
FIGS. 15, 16 and 17 are flowcharts of methods of color decomposition, respectively, according to exemplary embodiments of the inventive concept.

FIG. 15 is a flowchart of a method of color decomposition according to an exemplary embodiment of the inventive concept. For example, the method of color decomposition illustrated in FIG. 15 may correspond to an example of operation S240 of FIG. 13.

Referring to FIGS. 14 and 15 together, in operation S310, the first color C1 is assigned to some of patterns of the QPL layer, the patterns being arranged on an odd-numbered track. For example, the first color C1 may be assigned to some 931*a*, 931*b*, and 931*c* of the patterns of the second metal layer Mb, the patterns being arranged on odd-numbered tracks, in other words, first, third, and fifth tracks TR1, TR3, and TR5. In operation S330, the second color C2 is assigned to the rest of the patterns of the QPL layer, the patterns being arranged on the odd-numbered tracks. For example, the second color C2 may be assigned to the rest 932*a*, 932*b*, and 932*c* of the patterns of the second metal layer Mb, the patterns being arranged on the odd-numbered tracks, in other words, the first, third, and fifth tracks TR1, TR3, and TR5.

In operation S350, the third color C3 is assigned to some of patterns of the QPL layer, the patterns being arranged on an even-numbered track. For example, the third color C3 may be assigned to some 933*a*, 933*b*, and 933*c* of the patterns of the second metal layer Mb, the patterns being arranged on even-numbered tracks, in other words, second, fourth, and sixth tracks TR2, TR4, and TR6. In operation S370, the fourth color C4 is assigned to the rest of the patterns of the QPL layer, the patterns being arranged on the even-numbered tracks. For example, the fourth color C4 may be assigned to the rest 934*a*, 934*b*, and 934*c* of the patterns of the second metal layer Mb, the patterns being arranged on the even-numbered tracks, in other words, the second, fourth, and sixth tracks TR2, TR4, and TR6.

Figure 16:
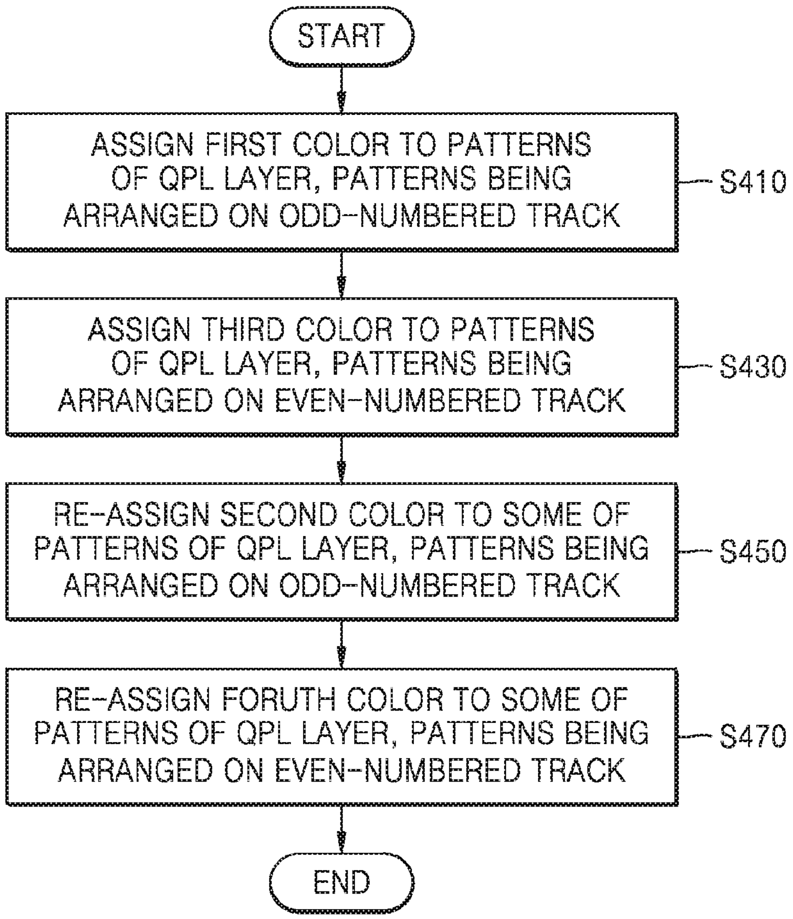

FIG. 16 is a flowchart of a method of color decomposition according to an exemplary embodiment of the inventive concept. For example, the method of color decomposition illustrated in FIG. 16 may correspond to an example of operation S240 of FIG. 13.

Referring to FIGS. 14 and 16 together, in operation S410, the first color C1 is assigned to the patterns of the QPL layer, the patterns being arranged on the odd-numbered track. For example, the first color C1 may be assigned to all of the patterns 931*a*, 932*a*, 931 *b*, 932*b*, 931*c*, and 932*c* of the second metal layer Mb, the patterns being arranged on the odd-numbered tracks, in other words, the first, third, and fifth tracks TR1, TR3, and TR5. In operation S430, the third color C3 is assigned to the patterns of the QPL layer, the patterns being arranged on the even-numbered track. For example, the third color C3 may be assigned to all of the patterns 933*a*, 934*a*, 933*b*, 934*b*, 933*c*, and 934*c* of the second metal layer Mb, the patterns being arranged on the even-numbered tracks, in other words, the second, fourth, and sixth tracks TR2, TR4, and TR6.

In operation S450, the second color C2 is re-assigned to some of the patterns of the QPL layer, the patterns being arranged on the odd-numbered track. For example, the second color C2 may be assigned to some 932*a*, 932*b*, and 932*c* of the patterns of the second metal layer Mb, the patterns being arranged on the odd-numbered tracks, in other words, the first, third, and fifth tracks TR1, TR3, and TR5. In operation S470, the fourth color C4 is re-assigned to some of the patterns of the QPL layer, the patterns being arranged on the even-numbered track. For example, the fourth color C4 may be assigned to some 934*a*, 934*b*, and 934*c* of the patterns of the second metal layer Mb, the patterns being arranged on the even-numbered tracks, in other words, the second, fourth, and sixth tracks TR2, TR4, and TR6.

Figure 17:
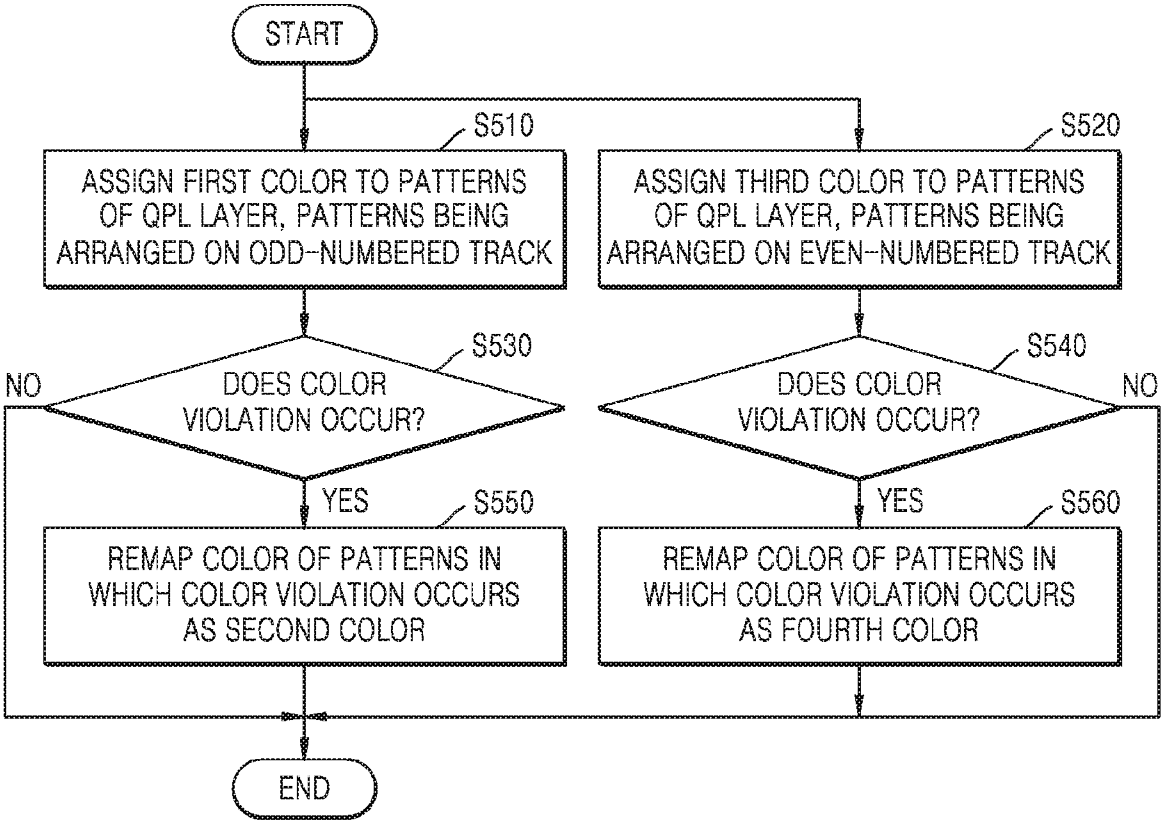

FIG. 17 is a flowchart of a method of color decomposition according to an exemplary embodiment of the inventive concept. For example, the method of color decomposition illustrated in FIG. 17 may correspond to an example of operation S240 of FIG. 13.

Referring to FIGS. 14 and 17 together, in operation S510, the first color C1 is assigned to the patterns of the QPL layer, the patterns being arranged on the odd-numbered track. In operation S520, the third color C3 is assigned to the patterns of the QPL layer, the patterns being arranged on the even-numbered track. In operation S530, it is determined whether a color violation occurs. When a color violation occurs, operation S550 is performed, and when a color violation does not occur, the operation is completed. In operation S540, it is determined whether a color violation occurs.

When a color violation occurs, operation S560 is performed, and when a color violation does not occur, the operation is completed. In operation S550, the color of the patterns in which the color violation occurs is remapped as the second color C2. In operation S560, the color of the patterns in which the color violation occurs is remapped as the fourth color C4.

Figure 18:
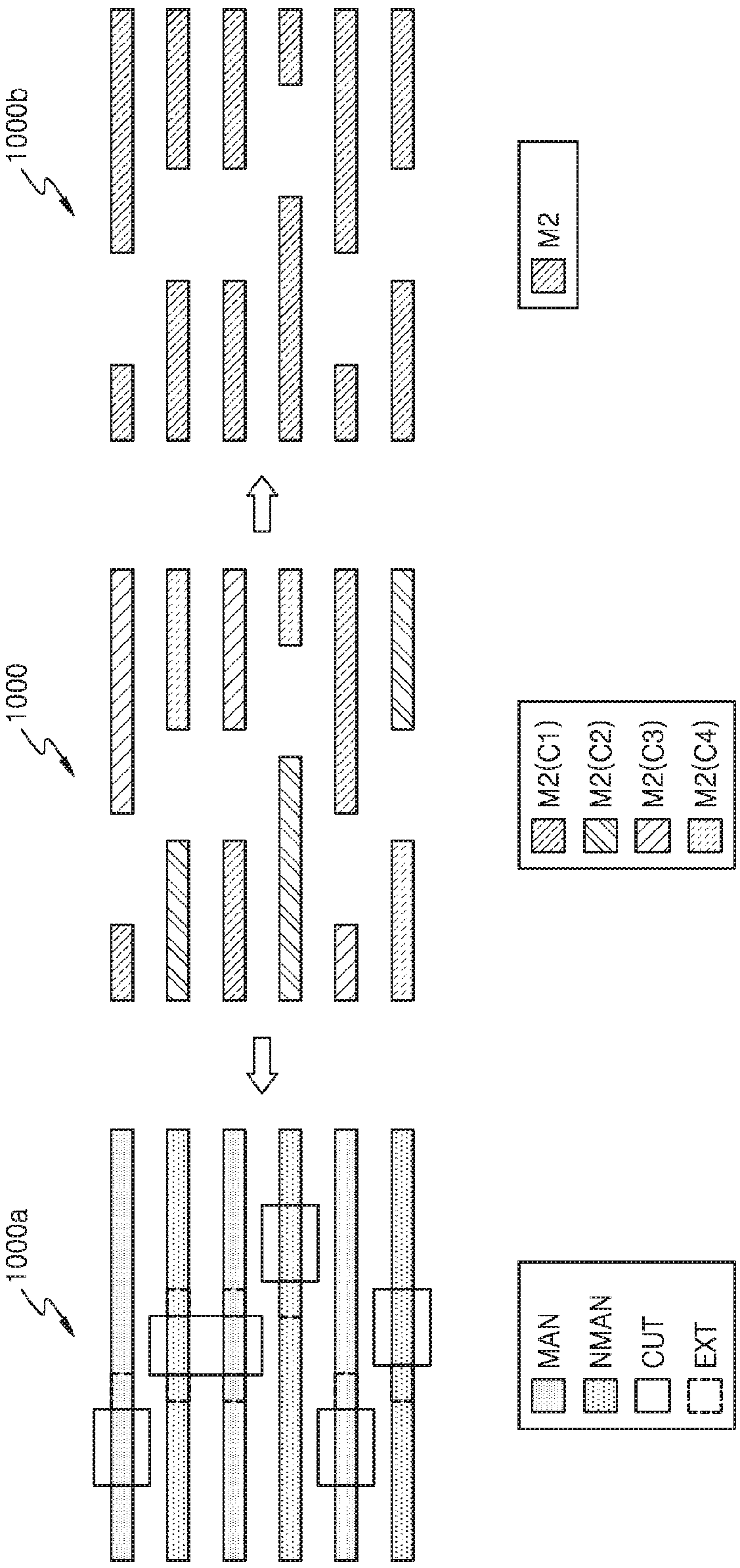
FIG. 18 shows a case in which a layout generated according to an exemplary embodiment of the inventive concept is re-used for other exposure apparatuses.

FIG. 18 shows a case in which a layout 1000 generated according to an exemplary embodiment of the inventive concept is re-used in other exposure apparatuses.

Referring to FIG. 18, the layout 1000 may include QPL layer patterns M2 to which first through fourth colors C1 through C4 are assigned. For example, the QPL layer patterns may correspond to the second metal layer M2 of FIG. 14. For example, the layout 1000 may be applied to ArF exposure apparatuses. The ArF exposure apparatuses may form the patterns M2 included in the layout 1000 based on a wafer, via a litho-etch-litho-etch-litho-etch-litho-etch (LELELELE) process using four masks.

According to an exemplary embodiment of the inventive concept, the layout 1000 may be corrected as a first layout 1000*a*. For example, the first layout 1000*a* may be generated by changing odd-numbered tracks of the QPL layer patterns M2 included in the layout 1000 as mandrel (MAN), changing even-numbered tracks of the QPL layer patterns M2 included in the layout 1000 as non-mandrel (NMAN), and arranging cut regions CUT on the mandrel (MAN) and the non-mandrel (NMAN). Extension regions (EXT) indicate portions extending from the mandrel (MAN) and the non-mandrel (NMAN) via the cut regions CUT. The first layout 1000*a* may be applied to self-aligned double patterning (SADP)/self-aligned quadruple patterning (SAQP) apparatuses. The SADP/SAQP apparatuses may form the patterns M2 included in the first layout 1000*a* based on a wafer, by using two masks.

According to an exemplary embodiment of the inventive concept, the layout 1000 may be corrected as a second layout 1000*b*. For example, the second layout 1000*b* may be generated by changing a color of the QPL layer patterns M2 included in the layout 1000 as, for example, the first color C1. The second layout 1000*b* may be applied to extreme ultraviolet (EUV) exposure apparatuses. The EUV exposure apparatuses may form the patterns M2 included in the second layout 1000*b* based on a wafer, by using one mask.

Figure 19A:
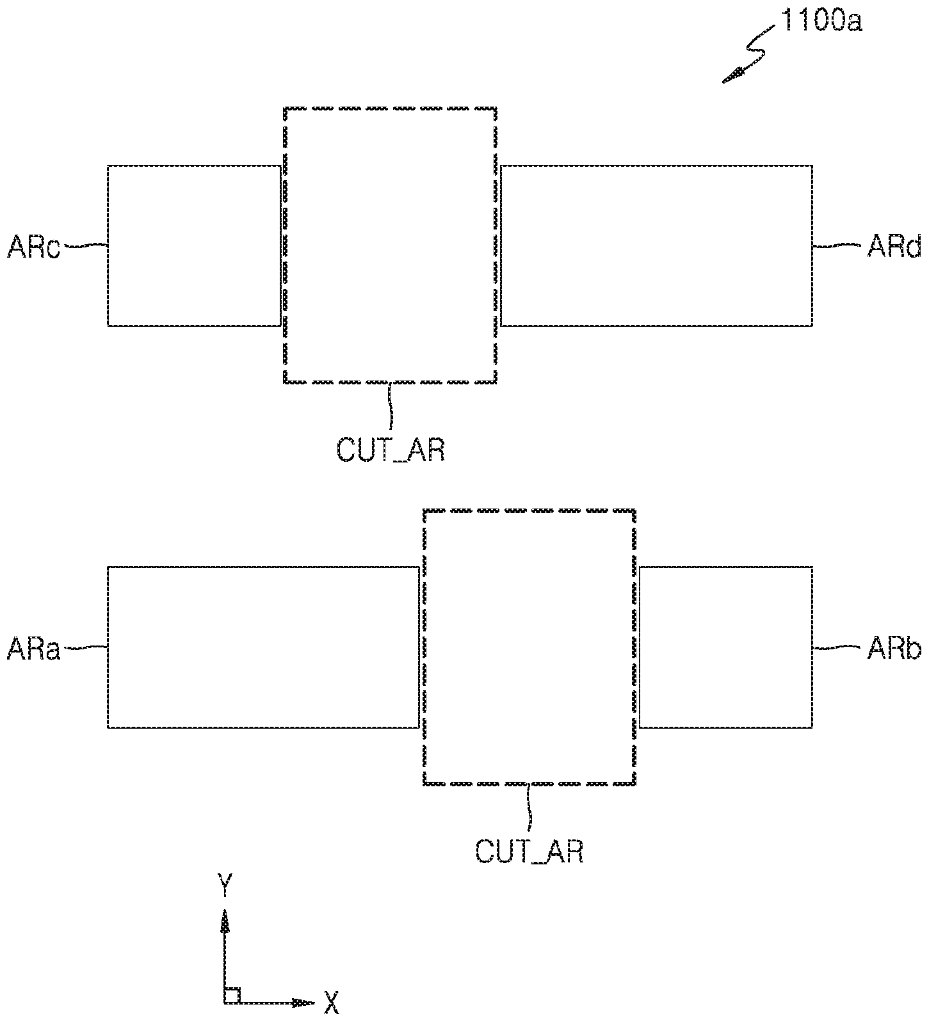
FIGS. 19A, 19B and 19C show integrated circuits to which QPL is applied, according to exemplary embodiments of the inventive concept.
Figure 19B:
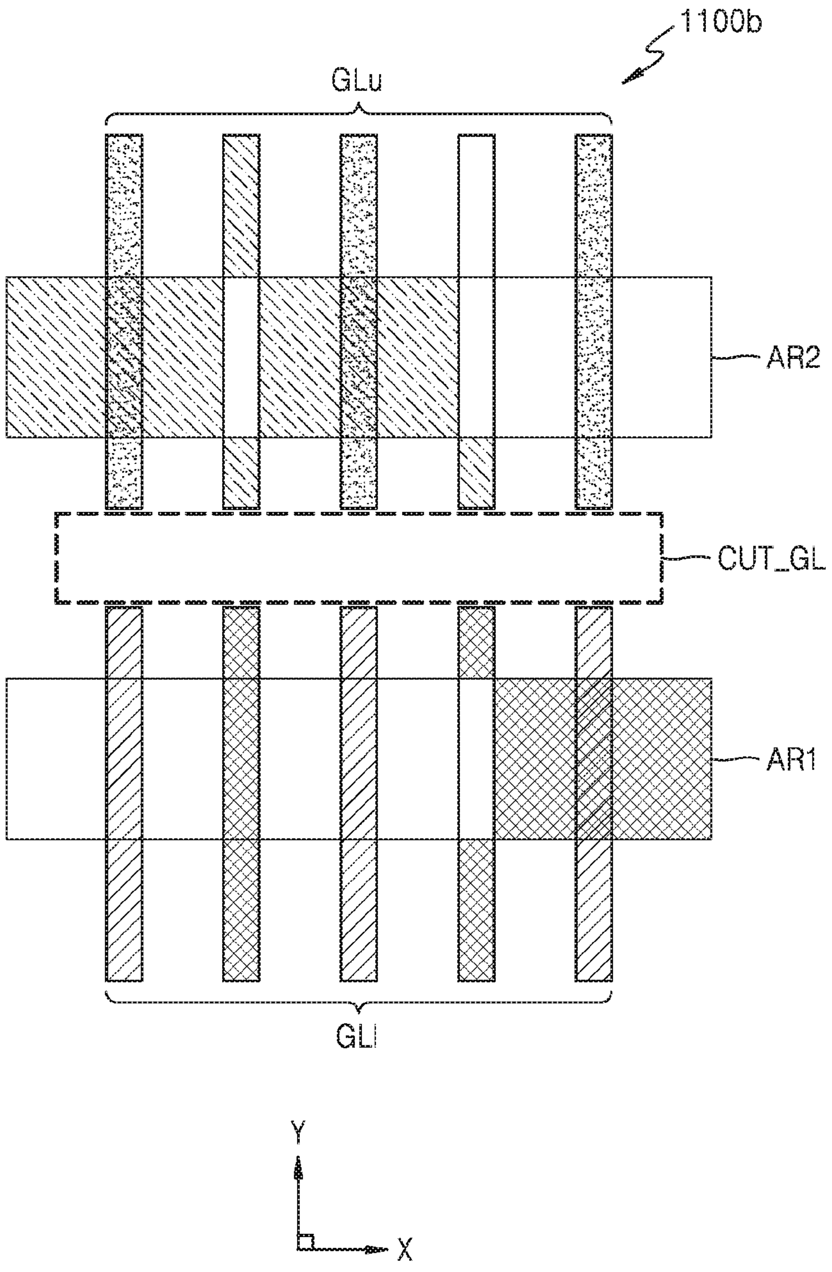
Figure 19C:
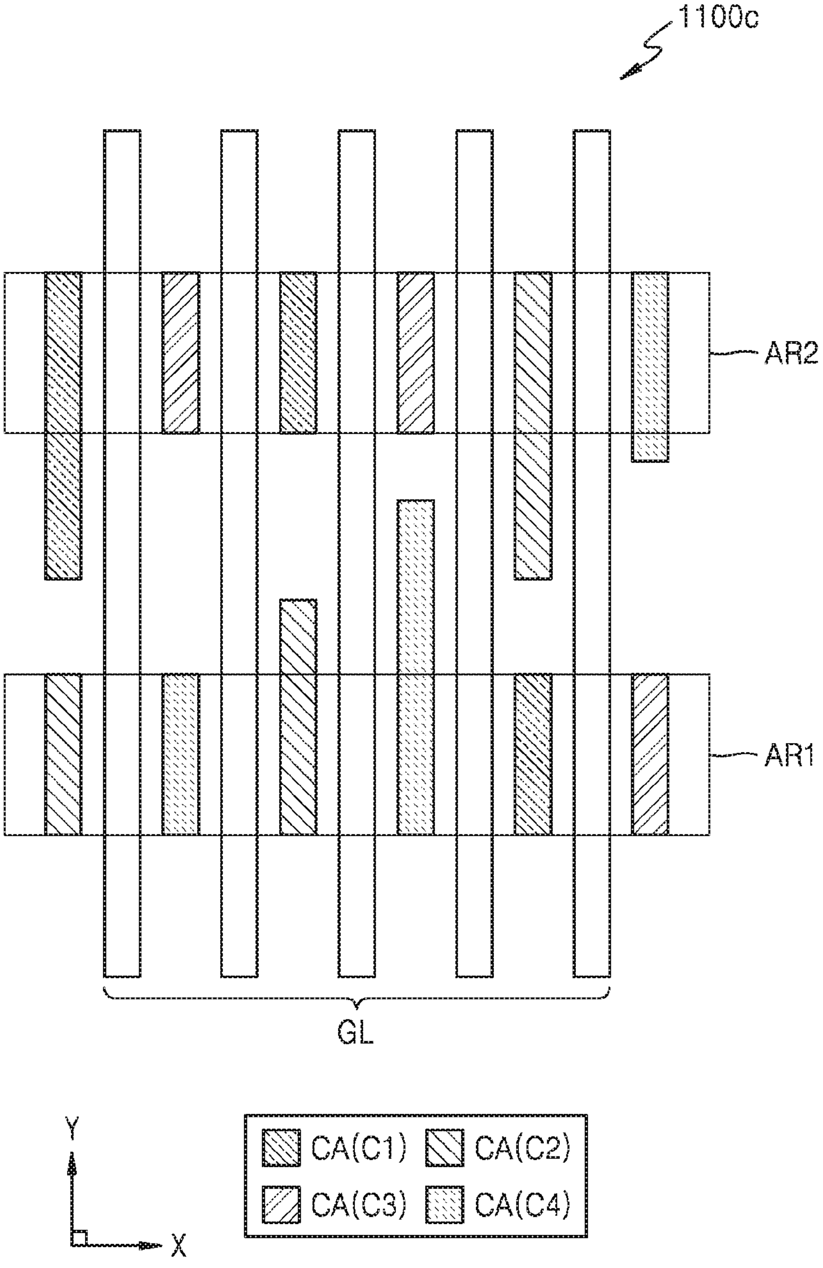

FIGS. 19A through 19C show integrate circuits 1100*a*, 1100*b*, and 1100*c* to which QPL is applied, according to exemplary embodiments of the inventive concept.

Referring to FIG. 19A, the integrated circuit 100*a* may include first through fourth active regions ARa through ARd to which first through fourth colors are assigned. According to the present embodiment, the first through fourth active regions ARa through ARd may be formed by assigning the first through fourth colors to the first through fourth active regions ARa through ARd, respectively, and by using first through fourth masks, without adding a cut region CUTAR.

Referring to FIG. 19B, the integrated circuit 1100*b* may include first and second active regions AR1 and AR2, a plurality of lower gate electrodes GL1 and a plurality of upper gate electrodes GLu. The first and second active regions AR1 and AR2 may extend in a second direction (for example, a direction X), the plurality of lower gate electrodes GL1 may extend on the first active region AR1 in a first direction (for example, a direction Y), and the plurality of upper gate electrodes GLu may extend on the second active region AR2 in the first direction Y. According to the present embodiment, the plurality of lower gate electrodes GL1 and the plurality of upper gate electrodes GLu may be formed by alternately assigning first and second colors to the plurality of lower gate electrodes GL1 and alternately assigning third and fourth colors to the plurality of upper gate electrodes GLu, and by using first through fourth masks, without adding a cut region CUT GL.

Referring to FIG. 19C, the integrated circuit 1100*c* may include the first and second active regions AR1 and AR2, the plurality of gate lines GL, and the plurality of contacts CA. The first and second active regions AR1 and AR2 may extend in the second direction X, the plurality of gate electrodes GL may extend on the first and second active regions AR1 and AR2 in the first direction Y, and the plurality of contacts CA may be arranged on the first and second active regions AR1 and AR2. According to the present embodiment, the plurality of contacts CA may be formed by assigning the first through fourth colors C1 through C4 to the plurality of contacts CA and by using first through fourth masks.

Figure 20:
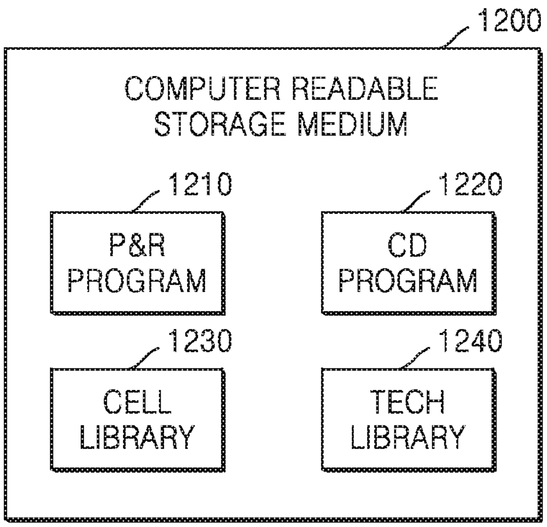
FIG. 20 shows a computer-readable storage medium according to an exemplary embodiment of the inventive concept.

FIG. 20 is shows a computer-readable storage medium 1200 according to an exemplary embodiment of the inventive concept. Referring to FIG. 20, the storage medium 1200 may store a P&R program 1210, a color decomposition program 1220, a cell library 1230, and a technology library 1240.

The P&R program 1210 may include a plurality of instructions for executing the method of generating the layout of the integrated circuit according to exemplary embodiments of the inventive concept. For example, the P&R program 1210 may be used to perform operations S100 and S120 of FIG. 1 and operations S210 and S230 of FIGS. 10 and 13. The color decomposition program 1220 may include a plurality of instructions for performing a color decomposition operation. For example, the color decomposition program 1220 may be used to perform operation S140 of FIG. 1 and operation S240 of FIG. 13.

The cell library 1230 may be a standard cell library and may include information about a standard cell, which is a unit for forming an integrated circuit. According to an exemplary embodiment of the inventive concept, the information about the standard cell may include layout information necessary to generate a layout. According to an exemplary embodiment of the inventive concept, the information about the standard cell may include timing information necessary for verification or simulation of the layout. The technology library 1240 may store a plurality of technology files.

While the inventive concept has been particularly shown and described with reference to exemplary embodiments thereof, it will be understood that various changes in form and details may be made therein without departing from the spirit and scope of the inventive concept as defined by the following claims.

What is claimed is:

1. A computer-implemented method for designing an integrated circuit, the method comprising:

placing standard cells based on design data defining the integrated circuit, wherein a width of at least one of a first lower pattern and a second lower pattern which are included in a lower layer of the placed standard cells is greater than a width of the other lower pattern included in the lower layer, wherein the first and second lower patterns extend in a first direction;

generating a layout of the integrated circuit by performing a routing in which first and second vias are respectively arranged on the first and second lower patterns, and first and second upper patterns are respectively arranged on the first and second vias, to be adjacent to each other in a second direction perpendicular to the first direction, the first and second upper patterns being included in an upper layer above the first and second vias; and storing the generated layout to a computer-readable storage medium, wherein the generating of the layout comprises at least one of arranging the first via on a first edge region of the first lower pattern, the first edge region being farther away from the second lower pattern than a second edge region of the first lower pattern, the second edge region being opposite to the first edge region, and arranging the second via on a third edge region of the second lower pattern, the third edge region being farther away from the first lower pattern than a fourth edge region of the second lower pattern, the fourth edge region being opposite to the third edge region, wherein a space between the first and second upper patterns is equal to or greater than a minimum space between patterns to which different colors are assigned such that a color violation between the first and second uppers patterns does not occur.

2. The method of claim 1, wherein a width of the first lower pattern in the second direction is greater than a width of the first via in the second direction, and a width of the second lower pattern in the second direction is greater than a width of the second via in the second direction.

3. The method of claim 1, wherein the first and second upper patterns are located on a first track, third and fourth upper patterns are located on a second track that is adjacent to the first track and extending in the second direction, the method further comprising, after the generating of the layout, assigning first through fourth colors respectively to the first through fourth upper patterns, the first through fourth colors respectively corresponding to first through fourth masks.

4. The method of claim 3, wherein the assigning comprises:

assigning the first color to at least one of the first to fourth upper patterns that are arranged on odd-numbered tracks;

assigning the second color to at least another of the first to fourth upper patterns that are arranged on the odd-numbered tracks;

assigning the third color to at least one of the first to fourth upper patterns that are arranged on even-numbered tracks; and assigning the fourth color to at least another of the first to fourth upper patterns that are arranged on the even-numbered tracks.

5. The method of claim 3, wherein the assigning comprises:

assigning the first color to at least one of the first to fourth upper patterns arranged on odd-numbered tracks;

assigning the third color to at least one of the first to fourth upper patterns arranged on even-numbered tracks;

re-assigning the second color to some of the first to fourth upper patterns to which the first color is assigned; and re-assigning the fourth color to some of the first to fourth upper patterns to which the third color is assigned.

6. The method of claim 3, wherein the assigning comprises:

assigning the first color to at least one of the first to fourth upper patterns arranged on odd-numbered tracks;

assigning the third color to at least one of the first to fourth upper patterns arranged on even-numbered tracks;

checking a color violation with respect to the first to fourth upper patterns;

remapping a color of a pattern from among the first to fourth upper patterns to which the first color is assigned, in which the color violation occurs, as the second color; and remapping a color of a pattern from among the first to fourth upper patterns to which the third color is assigned, in which the color violation occurs, as the fourth color.

7. The method of claim 1, wherein the generating of the layout further comprises:

arranging first and second active regions having different conductive types and extending in the second direction; and arranging a plurality of gate lines extending in the first direction across the first and second active regions and arranged in parallel to one another, wherein the lower layer is a wiring layer arranged above the plurality of gate lines.

8. A computing system for designing an integrated circuit, the system comprising:

a memory configured to store procedures for designing the integrated circuit; and a processor configured to access the memory and to execute the procedures, wherein the procedures comprise:

a placer configured to place standard cells based on design data defining the integrated circuit, wherein a width of at least one of a first lower pattern and a second lower pattern which are included in a lower layer of the placed standard cells and extend in a first direction, is greater than a width of the other lower pattern included in the lower layer; and a router configured to perform a routing in which first and second vias are respectively arranged on the first and second lower patterns, and first and second upper patterns are respectively arranged on the first and second vias to be adjacent to each other in a second direction perpendicular to the first direction, the first and second upper patterns being included in an upper layer above the first and second vias, wherein the router is configured to arrange the first via on a first edge region of the first lower pattern, the first edge region being farther away from the second lower pattern than a second edge region of the first lower pattern, the second edge region being opposite to the first edge region, or arrange the second via on a third edge region of the second lower pattern, the third edge region being farther away from the first lower pattern than a fourth edge region of the second lower pattern, the fourth edge region being opposite to the third edge region, wherein a space between the first and second upper patterns is equal to or greater than a minimum space between patterns to which different colors are assigned such that a color violation between the first and second uppers patterns does not occur.

9. The computing system of claim 8, wherein a width of the first lower pattern in the second direction is greater than a width of the first via in the second direction, and a width of the second lower pattern in the second direction is greater than a width of the second via in the second direction.

10. The computing system of claim 8, wherein the first and second upper patterns are located on a first track, the router is further configured to perform the routing in which third and fourth upper patterns located on a second track that is adjacent to the first track and extending in the second direction, and the procedures further comprise a color decomposer configured to assign first through fourth colors respectively to the first through fourth upper patterns, the first through fourth colors respectively corresponding to first through fourth masks.

11. The computing system of claim 10, wherein the color decomposer is further configured to:

assign the first color to at least one of the first to fourth upper patterns that are arranged on odd-numbered tracks;

assign the second color to at least another of the first to fourth upper patterns that are arranged on the odd-numbered tracks;

assign the third color to at least one of the first to fourth upper patterns that are arranged on even-numbered tracks; and assign the fourth color to at least another of the first to fourth upper patterns that are arranged on the even-numbered tracks.

12. The computing system of claim 10, wherein the color decomposer is further configured to:

assign the first color to at least one of the first to fourth upper patterns arranged on odd-numbered tracks;

assign the third color to at least one of the first to fourth upper patterns arranged on even-numbered tracks;

re-assign the second color to some of the first to fourth upper patterns to which the first color is assigned; and re-assign the fourth color to some of the first to fourth upper patterns to which the third color is assigned.

13. The computing system of claim 10, wherein the color decomposer is further configured to:

assign the first color to at least one of the first to fourth upper patterns arranged on odd-numbered tracks;

assign the third color to at least one of the first to fourth upper patterns arranged on even-numbered tracks;

check a color violation with respect to the first to fourth upper patterns;

remap a color of a pattern from among the first to fourth upper patterns to which the first color is assigned, in which the color violation occurs, as the second color; and remap a color of a pattern from among the first to fourth upper patterns to which the third color is assigned, in which the color violation occurs, as the fourth color.

14. The computing system of claim 8, wherein the router is further configured to:

arrange first and second active regions having different conductive types and extending in the second direction; and arrange a plurality of gate lines extending in the first direction across the first and second active regions and arranged in parallel to one another, wherein the lower layer is a wiring layer arranged above the plurality of gate lines.

15. A method of manufacturing a semiconductor device, the method being performed at least partially by a processor, and comprising:

placing standard cells based on design data defining the integrated circuit, wherein a width of at least one of a first lower pattern and a second lower pattern included in a lower layer of the placed standard cells, and extending in a first direction, is greater than a width of the other lower pattern included in the lower layer;

generating a layout of the integrated circuit by performing a routing in which first and second vias are respectively arranged on the first and second lower patterns, and first and second upper patterns are respectively arranged on the first and second vias, to be adjacent to each other in a second direction perpendicular to the first direction, the first and second upper patterns being included in an upper layer above the first and second vias; and manufacturing the semiconductor device based on the generated layout, wherein the generating of the layout comprises at least one of arranging the first via on a first edge region of the first lower pattern, the first edge region being farther away from the second lower pattern than a second edge region of the first lower pattern, the second edge region being opposite to the first edge region, and arranging the second via on a third edge region of the second lower pattern, the third edge region being farther away from the first lower pattern than a fourth edge region of the second lower pattern, the fourth edge region being opposite to the third edge region, wherein a space between the first and second upper patterns is equal to or greater than a minimum space between patterns to which different colors are assigned such that a color violation between the first and second uppers patterns does not occur.

16. The method of claim 15, wherein the first and second upper patterns are located on a first track, and third and fourth upper patterns are located on a second track that is adjacent to the first track and extending in the second direction, the method further comprising:

after the generating of the layout, assigning first through fourth colors respectively to the first through fourth upper patterns, wherein the manufacturing comprises forming first through fourth masks respectively corresponding to the first through fourth colors, based on the generated layout; and manufacturing the semiconductor device by using the first through fourth masks.

17. The method of claim 16, wherein the assigning comprises:

assigning the first color to at least one of the first to fourth upper patterns that are arranged on odd-numbered tracks;

assigning the second color to at least another of the first to fourth upper patterns that are arranged on the odd-numbered tracks;

assigning the third color to at least one of the first to fourth upper patterns that are arranged on even-numbered tracks; and assigning the fourth color to at least another of the first to fourth upper patterns that are arranged on the even-numbered tracks.

18. The method of claim 16, wherein the assigning comprises:

assigning the first color to at least one of the first to fourth upper patterns arranged on odd-numbered tracks;

assigning the third color to at least one of the first to fourth upper patterns arranged on even-numbered tracks;

re-assigning the second color to some of the first to fourth upper patterns to which the first color is assigned; and re-assigning the fourth color to some of the first to fourth upper patterns to which the third color is assigned.

19. The method of claim 16, wherein the assigning comprises:

assigning the first color to at least one of the first to fourth upper patterns arranged on odd-numbered tracks;

assigning the third color to at least one of the first to fourth upper patterns arranged on even-numbered tracks;

checking a color violation with respect to the first to fourth upper patterns;

remapping a color of a pattern from among the first to fourth upper patterns to which the first color is assigned, in which the color violation occurs, as the second color; and remapping a color of a pattern from among the first to fourth upper patterns to which the third color is assigned, in which the color violation occurs, as the fourth color.

20. The method of claim 15, wherein the generating of the layout further comprises:

arranging first and second active regions having different conductive types and extending in the second direction; and arranging a plurality of gate lines extending in the first direction across the first and second active regions and arranged in parallel to one another, wherein the lower layer is a wiring layer arranged above the plurality of gate lines.

* * * * *